(12) United States Patent
Io

(10) Patent No.: US 6,291,853 B1
(45) Date of Patent: Sep. 18, 2001

(54) NONVOLATILE SEMICONDUCTOR DEVICE HAVING A MEMORY CELLS EACH OF WHICH IS CONSTITUTED OF A MEMORY TRANSISTOR AND A SELECTION TRANSISTOR

(75) Inventor: Eiji Io, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/372,587

(22) Filed: Aug. 12, 1999

(30) Foreign Application Priority Data

Aug. 19, 1998 (JP) .................................................. 11-232421

(51) Int. Cl.[7] .................................................. H01L 29/788
(52) U.S. Cl. .......................... 257/315; 257/314; 257/316; 257/319; 365/218
(58) Field of Search ..................................... 257/316, 315, 257/314, 319–321; 365/185, 183, 184

(56) References Cited

U.S. PATENT DOCUMENTS

| | | | |
|---|---|---|---|
| 4,351,203 | * | 9/1982 | Masuoka et al. ..................... 365/218 |
| 5,326,999 | | 7/1994 | Kim et al. . |
| 5,471,422 | | 11/1995 | Chang et al. . |
| 5,793,081 | | 8/1998 | Tomioka et al. . |

FOREIGN PATENT DOCUMENTS

| | | |
|---|---|---|
| 0 663 695 | 7/1995 | (EP) . |
| 6325978 | 2/1988 | (JP) . |
| 63228670 | 9/1988 | (JP) . |
| 63299280 | 12/1988 | (JP) . |
| 63306670 | 12/1988 | (JP) . |
| 1309381 | 12/1989 | (JP) . |
| 6112501 | 4/1994 | (JP) . |
| 7106447 | 4/1995 | (JP) . |
| 7-297304 | 11/1995 | (JP) . |
| 7297304 | 11/1995 | (JP) . |
| 104149 | 1/1998 | (JP) . |
| 11177068 | 7/1999 | (JP) . |

* cited by examiner

Primary Examiner—Nathan Flynn
Assistant Examiner—Thomas Dickey
(74) Attorney, Agent, or Firm—Young & Thompson

(57) ABSTRACT

A tunnel oxide film 120, a first polysilicon layer 164, a poly-poly insulating film 132 and a second polysilicon layer 166 are formed on a semiconductor substrate in a memory cell area. After that, with two photo resists 168-S and 168-M as a mask, patterning is performed for the films, a layered product of the films formed according to the photo resist 168-S is taken as a gate electrode of a selection transistor S, and a layered product of the films formed according to the photo resist 168-M is taken as a gate electrode of a memory transistor M.

14 Claims, 28 Drawing Sheets

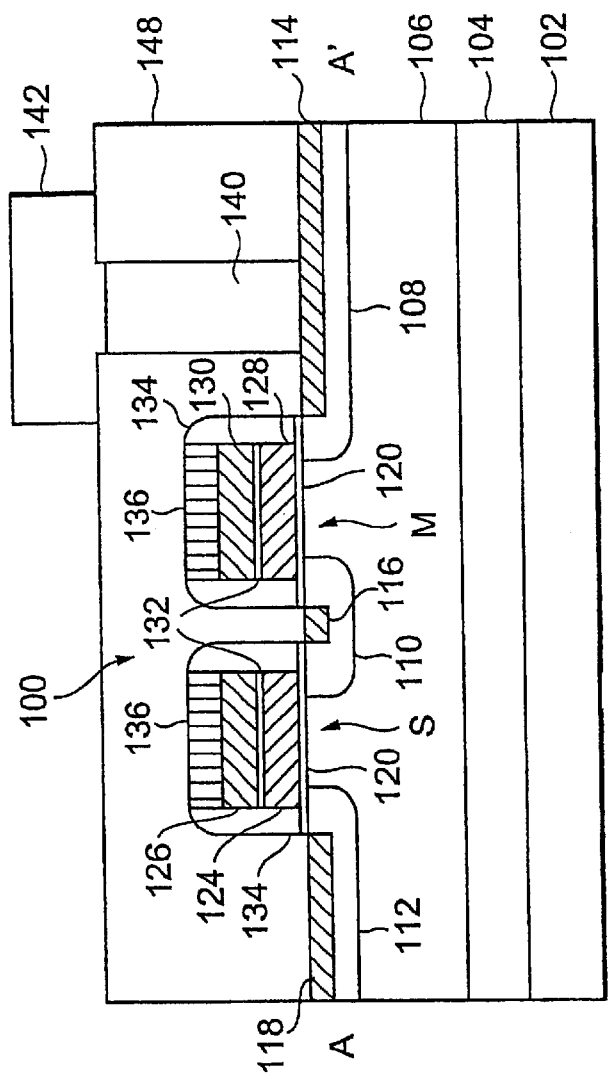
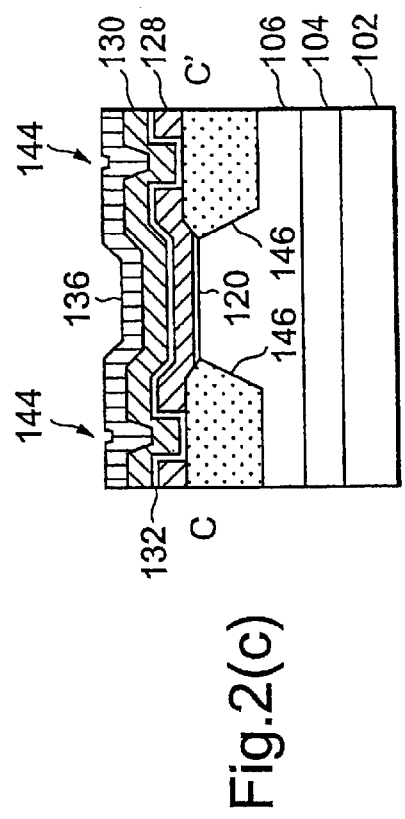
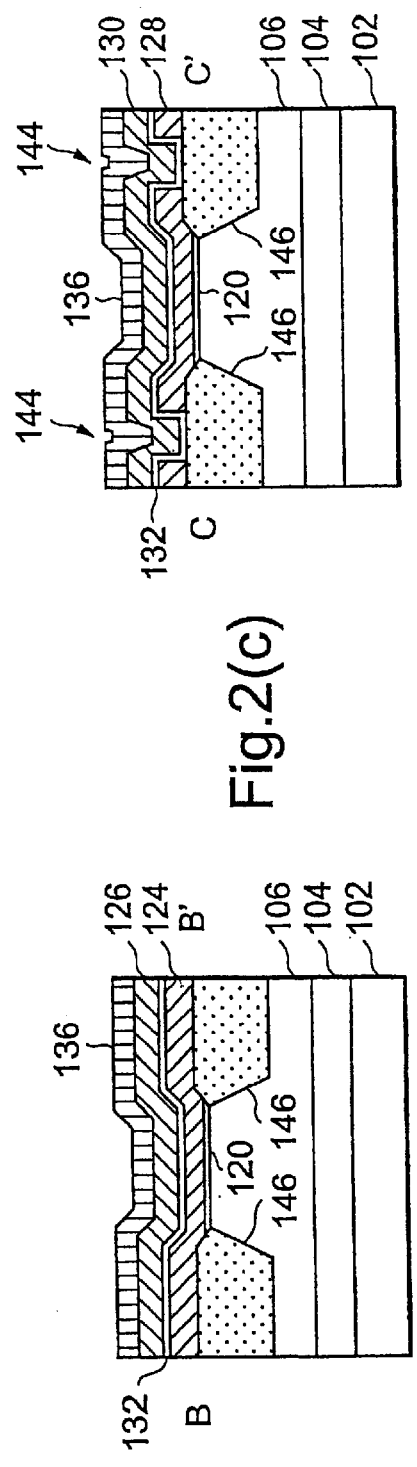
Fig.2(a)
Fig.2(b)
Fig.2(c)

|  | SOURCE | SELECTION GATE | CONTROL GATE | DRAIN | WELL |
|---|---|---|---|---|---|
| WRITE | OPEN | 0V | -9V | 6V | 0V |
| ERASE | -4V | 0V | 11V | OPEN | -4V |
| READ | 0V | Vcc | Vcc | 1V | 0V |

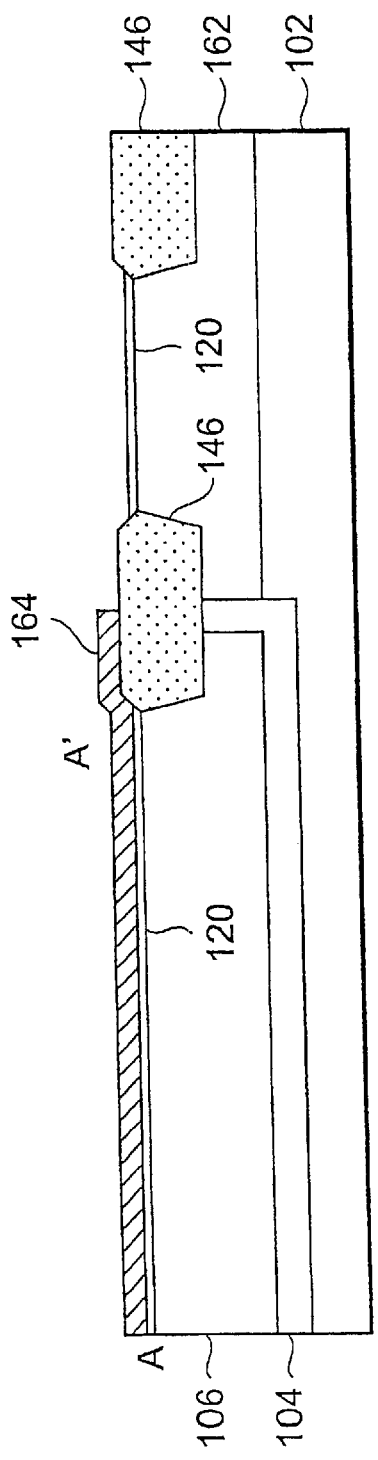
Fig.9(a)
Fig.9(c)
Fig.9(b)

NONVOLATILE SEMICONDUCTOR DEVICE HAVING A MEMORY CELLS EACH OF WHICH IS CONSTITUTED OF A MEMORY TRANSISTOR AND A SELECTION TRANSISTOR

BACKGROUND OF THE INVENTION

1. Field of the Invention

This invention relates to a nonvolatile semiconductor memory device, a manufacturing method therefor, a microcomputer with a built-in nonvolatile semiconductor memory device, and a manufacturing method therefor and particularly to the nonvolatile semiconductor memory device excellent in compatibility with the manufacturing process for the microcomputer and the manufacturing method therefor.

2. Description of the Related Art

Recently as a semiconductor memory suitable for high integration (large capacity) while being a nonvolatile memory, a flash memory has been remarkably watched. A memory cell of the flash memory is basically formed by one memory cell transistor having a floating gate, and the threshold of the memory cell transistor is changed by accumulating charges in the floating gate, thereby storing the information to be nonvolatile. Thus, in the flash memory, the memory cell is basically formed by one memory cell transistor only, so that the area occupied by one memory cell is small. This is a major reason why the flash memory is suitable for high integration.

However, as the memory cell transistor is formed by one transistor in the flash memory, it is necessary to adjust the threshold of the memory cell transistor with high accuracy. That is, generally in the flash memory, each memory cell is not provided with a selection transistor, and each memory cell is required to judge whether selected or not from its own threshold voltage, so it is insufficient to simply set the threshold to a high value or a low value according to the information to be stored. For example, in the case of storing one logic level in a memory cell (writing data), the threshold voltage of the memory cell transistor should be set to a voltage equal to or higher than the gate voltage when selected, and in the case of storing the other logic level in the memory cell (erasing data), the threshold voltage of the memory cell transistor should be set to a voltage equal to or lower than the gate voltage when selected and higher than the gate voltage when not selected.

Accordingly, though in writing data, it is not necessary to adjust the threshold with high accuracy, in erasing data, it is necessary to control the threshold with high accuracy to converge the threshold voltage of the memory cell transistor in the above range. Supposing that the threshold voltage in erasing data becomes low to excess to be equal to or lower than the gate voltage when not selected, the memory cell transistor is always in conduction whether selected or not selected to be unreadable, that is, cause the so-called "overerase". Although the flash memory is characterized by batch erasion in block units, a number of memory cells included in each block are not uniform in the erasing characteristic, which has many difficulties in converging the threshold voltage in the above range at the time of erasing a number of memory cells which are batch erased.

Various methods for preventing the above overerase problem have been proposed. One is a method using a split gate type transistor. The split gate type transistor is, so speak, of a memory cell structure in which a selection transistor is integrated with a memory cell transistor. By using such a memory cell structure, even if the memory transistor is in the overerase state, a selection transistor surely secures the non-conducting state of the memory cell when not selected. Thus, it is not necessary to converge the threshold voltage of the memory transistor in erasing in the above range, so that the erasing operation is facilitated.

The split gate type memory cell, however, has the problem that the manufacturing process therefor is complicated. Especially, in the case of integrating it on the same semiconductor substrate as that of a microcomputer or the like, the difficulty in process is caused because the manufacturing process remarkably different from the manufacturing process for the microcomputer or the like is needed.

On the other hand, Japanese Patent Laid-Open No. 7-297304 discloses the technology in which the memory cell is not formed as a split gate type transistor, but formed by two transistors, a separate transistor and a memory transistor to facilitate the manufacturing process. However, according to this technology, the area occupied by one memory cell is remarkably increased. The condition will be described with reference to FIGS. 26 to 30.

FIGS. 26 to 30 are process drawings showing the manufacturing process for a nonvolatile semiconductor memory device according to the technology disclosed in Japanese Patent Laid-Open No. 7-297304.

First, as shown in FIG. 26, a tunnel oxide film 12 and a first polysilicon layer 14 are formed on a semiconductor substrate 10 to form a photo resist 16. Subsequently, as shown in FIG. 27, the first polysilicon layer 14 is selectively subjected to plasma etching with the photo resist 16 as a mask to simultaneously form a gate electrode 20 of a selection transistor S and a floating gate electrode 22 of a memory transistor M. Subsequently, ion implantation is performed with the photo resist 16 and the gate electrodes 20, 22 as a mask to form a source diffusion layer 18 of the selection transistor S, a diffusion layer 24 which is a source diffusion layer of the memory transistor M and also a drain diffusion layer of the selection transistor S, and a drain diffusion layer 26 of the memory transistor M in self-aligning manner.

Subsequently, as shown in FIG. 28, after the photo resist 16 is separated, a poly-poly insulating film (ONO film) 28 is formed, and a second polysilicon film 30 thereon. Subsequently, a photoresist not shown is formed, and plasma etching is performed with the photo resist as a mask to form a control gate electrode 32 of the memory transistor M, as shown in FIG. 29, with the second polysilicon layer left on the floating gate electrode 22 of the memory transistor M. Then, a drain contact 36 is formed in the drain diffusion layer of the memory transistor M. In FIG. 29, the drain contact 36 is shown by its one wall surface only for convenience.

FIG. 30 is a plan view of the thus manufactured memory cell, and FIG. 29 is a sectional view taken along line A—A' of FIG. 30.

According to the method, the manufacturing process for the memory cell is comparatively simple, but the space between the memory transistor M and the selection transistor S needs to be large for a patterning process (FIG. 27) for the floating gate electrode 22 of the memory transistor M and the gate electrode 20 of the selection transistor S and the patterning process (FIG. 29) for the control gate electrode 32 of the memory transistor M. That is, supposing that the film thickness of the second polysilicon layer 30 is 0.15 μm, the gate space between both transistors is needed to be about 0.6 μm in consideration of the fact that a part formed to be the edge of the second polysilicon layer 30 should be flat in patterning. In addition, when a margin (about 0.1 µm on one side) for the irregular stitch is given, a large space as much as about 0.8 µm is needed. Similarly, a large space is needed between the floating gate electrode 22 and the drain contact 36 of the memory transistor. Therefore, the method is not suitable for high integration, and in the case of performing mixed loading with the microcomputer, the microworking technology used in the latest CMOS logic process can not be effectively utilized.

Further, there is the possibility that the patterning remainder 34 of the second polysilicon layer is produced on the side of the gate electrode of the selection transistor S. In the case where the remainder 34 and the control gate electrode 32 are short-circuited, in erasing the memory cell, a large potential difference is locally produced between the gate electrode 20 and the remainder 34 of the selection transistor S, which results in the possibility of breaking the poly-poly insulating film 28. Even if the short-circuit is avoided, there is the possibility that in the course of the manufacturing process, the remainder 34 is separated to cause contamination.

SUMMARY OF THE INVENTION

Accordingly, it is an object of the invention to provide a nonvolatile semiconductor memory device which is simple in the manufacturing process and suitable for high integration, and a manufacturing process therefor.

It is another object of the invention to provide a nonvolatile semiconductor memory device which is simple in the manufacturing process and suitable for high integration, and by which even in the case where the memory transistor is overerased, in non-selection, the non-conducting state is secured, and a manufacturing process therefor.

It is still another object of the invention to provide a microcomputer with a built-in nonvolatile semiconductor memory device which is simple in the manufacturing process and suitable for high integration, and a manufacturing method therefor.

It is a further object of the invention to provide a microcomputer with a built-in nonvolatile semiconductor memory device excellent in compatibility with the manufacturing process for the microcomputer and a manufacturing method therefor.

According to the invention, a nonvolatile semiconductor memory device comprises a first, a second and a third impurity diffusion regions formed on a semiconductor substrate, a first gate insulating film formed on the semiconductor substrate between the first and second impurity diffusion regions, a second gate insulating film formed on the semiconductor substrate between the second and third impurity diffusion region, a floating gate electrode formed on the first gate insulating film, a selection gate electrode formed on the second gate insulating film, a third gate insulating film formed on the floating gate electrode, a fourth gate insulating film formed on the selection gate electrode, a control gate electrode formed on the third gate insulating film, and an additional gate electrode formed on the fourth gate insulating film.

Further, according to the invention, a nonvolatile semiconductor memory device comprises a floating gate electrode pattern in which a floating gate electrode is intermittently extended in one direction, a first poly-poly insulating film pattern in which a first poly-poly insulating film formed on the floating gate electrode pattern is continuously extended in the above one direction, a control gate electrode pattern in which a control gate electrode formed on the first poly-poly insulating film pattern is continuously extended in the above one direction, a selection gate electrode pattern in which a selection gate electrode formed adjacent to the floating gate electrode pattern is continuously extended in the above one direction, a second poly-poly insulating film pattern in which a second poly-poly insulating film formed on the selection gate electrode pattern is continuously extended in the above one direction, and an additional gate electrode pattern in which an additional gate electrode pattern formed on the second poly-poly insulating film pattern is continuously extended in the above one direction, wherein the gate of a memory transistor is formed by the respective floating gate electrodes and the control gate electrode existent thereon, and the gate of a selection transistor is formed by a selection gate electrode of a part adjacent to the respective floating gate electrodes and the additional gate electrode existent thereon.

Further, according to the invention, a microcomputer has such a nonvolatile semiconductor memory device built therein.

Further, according to the invention, a manufacturing method for a nonvolatile semiconductor memory device comprises a process of forming a tunnel oxide film on a semiconductor substrate, a process of forming a first polysilicon layer on the tunnel oxide film, a process of forming a poly-poly insulating film on the first polysilicon layer, a process of forming a second polysilicon layer on the poly-poly insulating film, a process of forming a first and a second photo resists on the second polysilicon layer, a process of patterning the second polysilicon layer, the poly-poly insulating film and the first polysilicon layer with the first and second photo resists as a mask to form a first and a second layered products, and a process of performing ion implantation in the semiconductor substrate with the first and second layered products as a mask, wherein the first layered product is taken as a gate electrode of a memory transistor, and the second layered product is taken as a gate electrode of a selection transistor.

Further, according to the invention, a manufacturing method for a nonvolatile semiconductor memory device comprises a process of selectively forming a field oxide film on a semiconductor substrate, a process of forming a tunnel oxide film on the semiconductor substrate where the field oxide film is not formed, a process of forming a first polysilicon layer on the field oxide film and the tunnel oxide film, a process of forming a poly-poly insulating film on the first polysilicon layer, a process of forming a second polysilicon layer on the poly-poly insulating film, a process of forming a first and a second photo resists on the second polysilicon layer, a process of patterning the second polysilicon layer, the poly-poly insulating film and the first polysilicon layer with the first and second photo resists as a mask to form a first and a second layered products extending over the field oxide film and the tunnel oxide film, a process of removing the second polysilicon layer and the poly-poly insulating film at least in a part of an area of the second layered product which exists on the field oxide film to expose the first polysilicon layer, a process of forming a layer insulating film, a process of forming a first contact hole for exposing at least a part of the second polysilicon layer in an area of the first layered product which exists on the field oxide film in the layer insulating film, a process of forming a second contact hole for exposing the first polysilicon layer exposed in the above area of the second layered product which exists on the field oxide film in the layer insulating film, a process of forming a first metal wiring electrically connected to the second polysilicon layer of the first layered product through the first contact hole, and a process of forming a second metal wiring electrically connected to the first polysilicon layer of the second layered product through the second contact hole.

Further, according to the invention, a manufacturing method for a microcomputer with a built-in nonvolatile semiconductor memory device, comprises a process of forming a tunnel oxide film, a first polysilicon layer and a poly-poly insulating film on a semiconductor substrate in a memory cell area, a process of forming a gate oxide film on a semiconductor substrate in a logic area where to form a microcomputer, a process of forming a second polysilicon layer on the poly-poly insulating film and the gate oxide film, a process of forming a first and a second photo resists respectively covering a part of the second polysilicon layer in the memory cell area, and a third photo resist for covering the entire surface of the second polysilicon layer in the logic area, a process of patterning the second polysilicon layer, the poly-poly insulating film and the first polysilicon layer with the first, second and third photo resists as a mask to form a first and a second layered products in the memory cell area, a process of performing ion implantation in the semiconductor substrate with the first and second layered products as a mask to form an impurity diffusion region in the semiconductor substrate in the memory cell area, a process of patterning the second polysilicon layer in the logic area to form a gate electrode, and a process of performing ion implantation in the semiconductor substrate with the gate electrode as a mask to form an impurity diffusion region in the semiconductor substrate in the logic area.

BRIEF DESCRIPTION OF THE DRAWINGS

FIGS. 2(a) to 2(c) are sectional views taken along line A—A', line B—B' and line C—C' of FIG. 1, respectively;

FIGS. 9(a) to 9(c) are sectional views taken along line A—A', line B—B' and line C—C' of FIG. 8, respectively;

DETAILED DESCRIPTION OF THE PREFERRED EMBODIMENTS

The structure of a nonvolatile semiconductor memory device according to an embodiment of the invention will be first described. In the present embodiment, a nonvolatile semiconductor memory device built in a microcomputer will be described. The nonvolatile semiconductor memory device of the invention is not limited to the memory device built in the microcomputer, but it may be built in the other logic LSI, and further be a stand-alone nonvolatile semiconductor memory device, not being built in the microcomputer.

Figure 1:
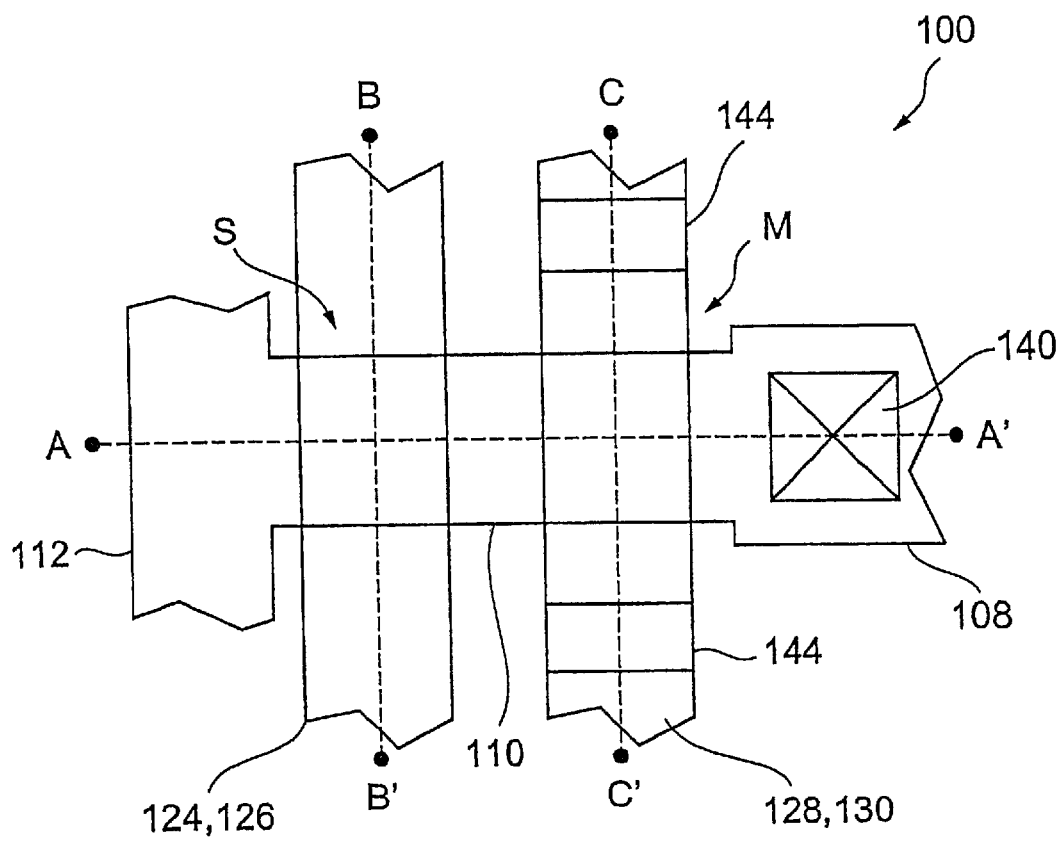
FIG. 1 is a plan view showing the structure of a memory cell of a nonvolatile semiconductor memory device according to an embodiment of the invention.

The memory cell structure of the nonvolatile semiconductor memory device according to the embodiment is shown in FIG. 1 and FIG. 2. FIG. 1 is a plan view of the memory cell structure, and FIG. 2(a) is a sectional view taken along line A—A' of FIG. 1, FIG. 2(b) is a sectional view taken along line B—B' of FIG. 1, and FIG. 2(c) is a sectional view taken along line C—C' of FIG. 1.

As shown in FIG. 2(a), a memory cell 100 of the nonvolatile semiconductor memory device according to the embodiment is of a two transistor structure comprising a memory transistor M and a selection transistor S, and the memory transistor M and the selection transistor S have the substantially same structure. That is, the memory transistor M and the selection transistor S are connected in series between a drain wire 142 and a source wire 112, the memory transistor M has a two-layer gate structure comprising a floating gate electrode 128 and a control gate electrode 130, and the selection transistor S also has a two-layer gate structure comprising a first gate electrode (selection gate electrode) 124 and a second gate electrode (additional gate electrode) 126. The advantage that thus the memory transistor M and the selection transistor S are of the substantially same structure will be mentioned later.

The memory cell 100 is continuously formed in the vertical direction of the paper surface in FIG. 1, for example, thirty-two memory cells being continuously formed. Accordingly, as shown in FIG. 2(b), a first gate electrode (selection gate electrode) 124 and a second gate electrode 126 of the selection transistor S are formed continuously without interruption in the vertical direction of the paper surface in FIG. 1. Further, as shown in FIG. 2(c), the control gate electrode 130 of the memory transistor M is also formed continuously without interruption in the vertical direction of the paper surface in FIG. 1, but the floating gate electrode 128 is separated by a separation pattern 144 for each cell 100. Accordingly, concerning the memory transistor M, the floating gate electrode 128 is independent by each memory cell, and the control gate electrode 130 is continuously formed to be common to the respective memory cells.

The structure of the memory cell 100 shown in FIGS. 1 and 2 will be described more in detail. The memory transistor M comprises a drain region 108, a source region 110 (this region also serves as a drain region of the selection transistor S), the floating gate electrode 128, and the control gate electrode 130. A titanic silicide (TiSi) layer 114 is formed on the surface of the drain region 108, and a titanic silicide (TiSi) layer 116 is formed on the surface of a source region 110 to reduce resistance. The floating gate electrode 128 is formed on a P-well 106 through a tunnel oxide film 120, and the control gate electrode 130 is formed on the floating gate electrode 128 through a poly-poly insulating film 132. Further, a tungsten silicide (WSi) layer 136 is formed on the upper surface of the control gate electrode 130 to reduce resistance.

Similarly the selection transistor S comprises a drain region 110 (this region also serves as a source region of the memory transistor M), a source region 112, the first gate electrode (selection gate electrode) 124, and the second gate electrode 126. A titanic silicide (TiSi) layer 118 is formed on the surface of the source region 112 to reduce resistance. The selection gate electrode 124 is formed on the P-well 106 through the tunnel oxide film 120, and the second gate electrode 126 is formed on the selection gate electrode 124 through the poly-poly insulating film 132. A tungsten silicide (WSi) layer 136 is formed on the upper surface of the second gate electrode 126 to reduce resistance.

As shown in FIG. 2(a), the whole of the memory cell 100 is covered with a layer insulating film 148, and the drain region 108 of the memory cell 100 is led out to an aluminium wiring layer 142 through a contact hole 140 formed in the layer insulating film 148.

Figure 3:
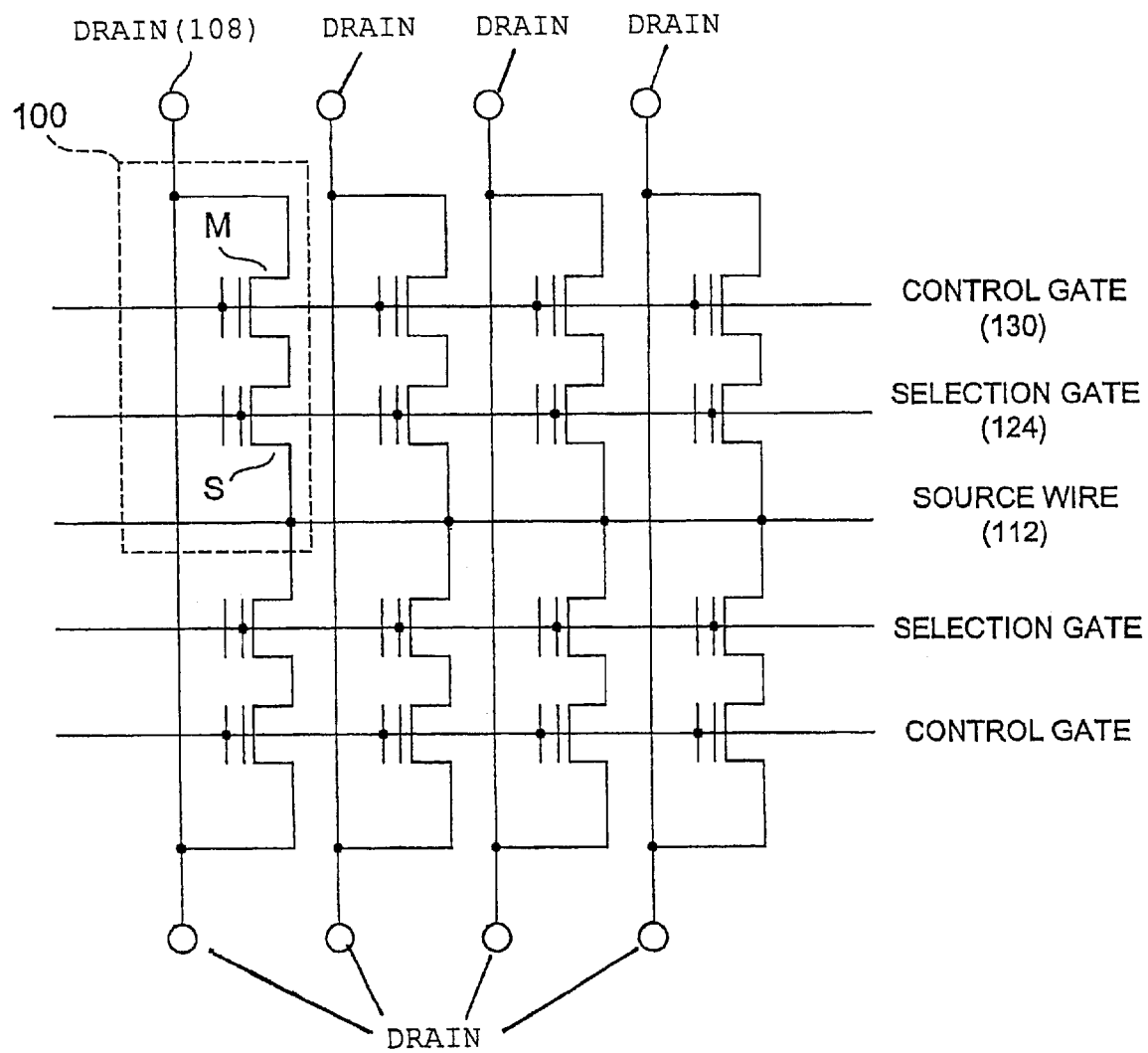
FIG. 3 is a schematic circuit diagram of a nonvolatile semiconductor memory device according to an embodiment of the invention.

FIG. 3 is a circuit diagram showing the connection relationship between the respective memory cells 100. It is remarked that between two transistors constructing the memory cell 100, for the memory transistor M, wiring is connected to the control gate electrode 130, that is, an upper layer gate electrode, and for the selection transistor S, wiring is connected to the selection gate 124, that is, a lower layer gate electrode.

The respective memory cells arranged on the right side of the memory cell 100 shown in FIG. 3, that is, the respective memory cells sharing the control gate 130 and the selection gate 124 with the memory cell 100 correspond to the memory cells formed continuously in the vertical direction of the paper surface in FIG. 1 described above.

Figures 4, 5:
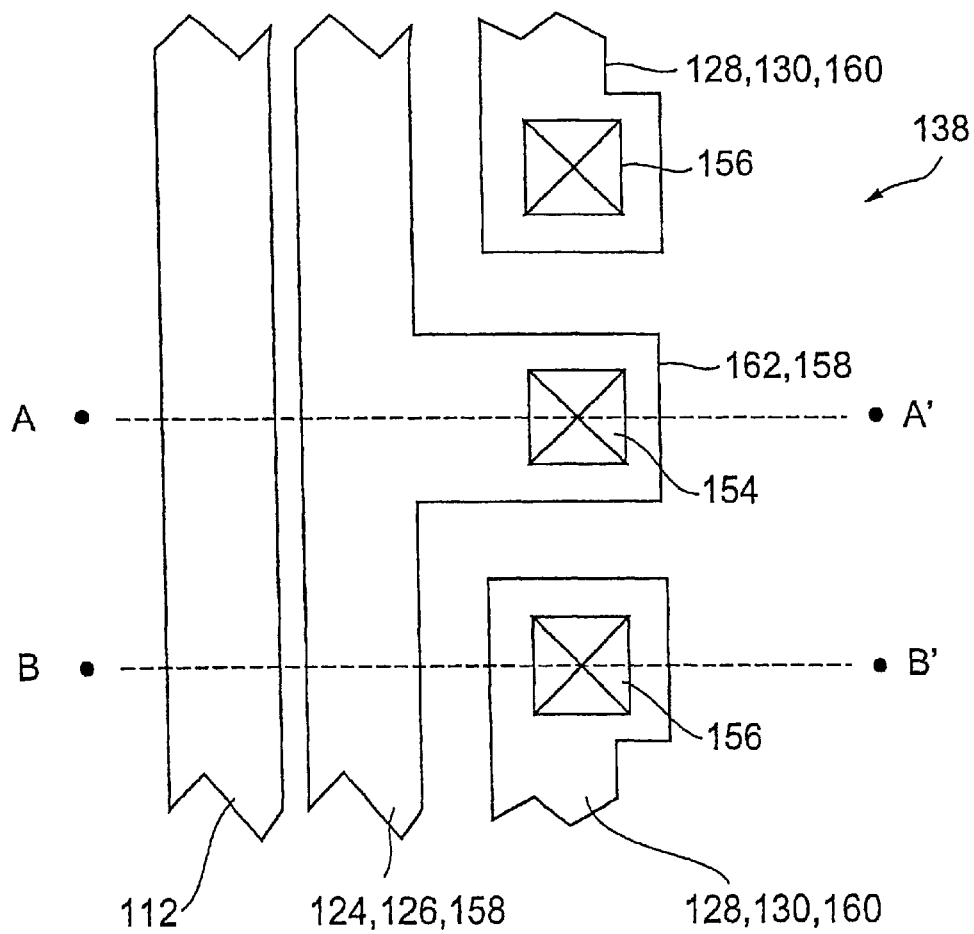
FIG. 4 is a diagram showing the voltage applied to the respective electrodes in the case of writing, erasing and reading for a memory cell 100 of a nonvolatile semiconductor memory device according to a embodiment of the invention.
FIG. 5 is a plan view showing a backing part 138 of a nonvolatile semiconductor memory device according to an embodiment of the invention.

FIG. 4 shows the voltages applied to the respective electrodes in the case of performing each operation of "write", "erase" and "read" for the memory cell 100.

FIG. 5 is a plan view showing a backing part 138 existing on an extension line in the vertical direction of the paper surface in FIG. 1. Supposing that as in the above example, thirty-two memory cells 100 are continuously formed, for example, the backing parts 138 appear at intervals of thirty-two memory cells 100 to connect the control gate electrode 130 and the selection gate electrode 124 of the memory cells 100 to an upper layer wiring. That is, the backing parts are provided at intervals of thirty-two memory cells 100 formed in a large number in a line, thereby backing the control gate electrode 130 and the selection gate electrode 124 of many memory cells 100. The insert intervals of the backing parts 138 are not limited to the intervals of thirty-two memory cells, but it may be determined according to a balance of wiring delay of the control gate electrode 130 and the selection gate electrode 124 and an increase in chip area caused by inserting the backing part 138. Accordingly, in the case where the wiring delay is needed to be further reduced, it will be sufficient to insert the backing parts at the intervals of sixteen memory cells. On the contrary, in the case where the reduction of the chip area is taken seriously more than the reduction of wiring delay, it will be sufficient to insert the backing parts at the intervals of sixty-four memory cells.

Figure 6A:
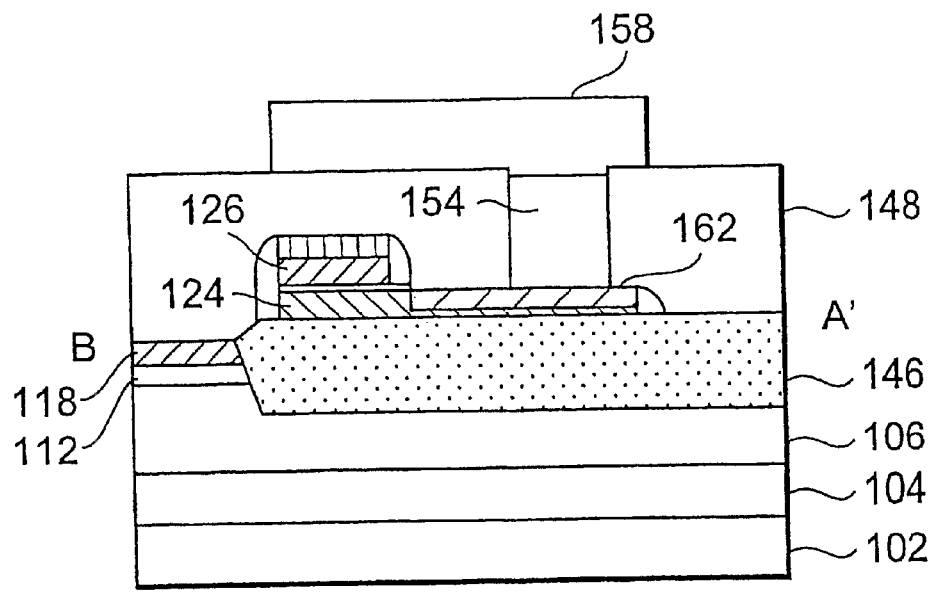
FIGS. 6(a) and 6(b) are sectional views taken along line A—A' and line B—B' of FIG. 5, respectively.
Figure 6B:
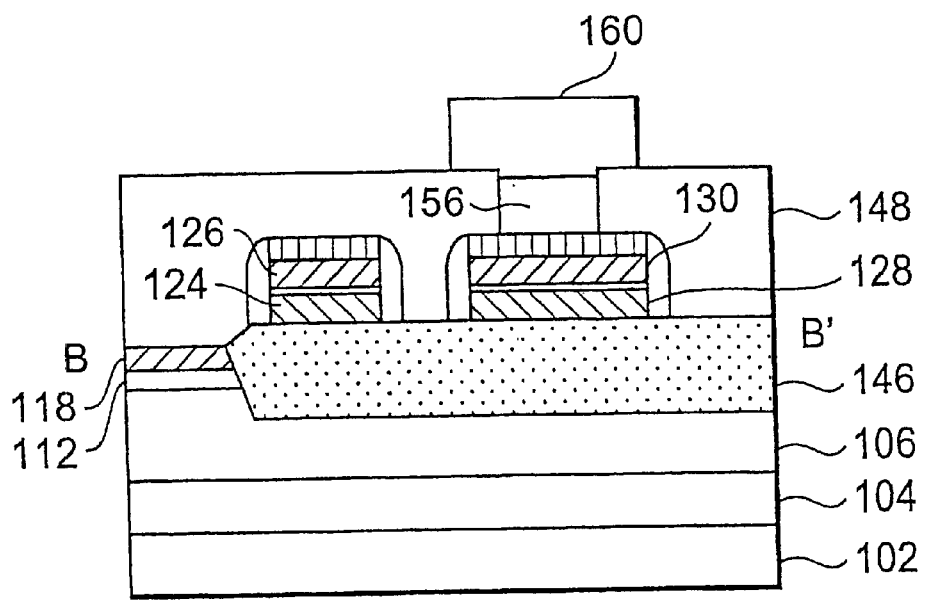
Figure 7:
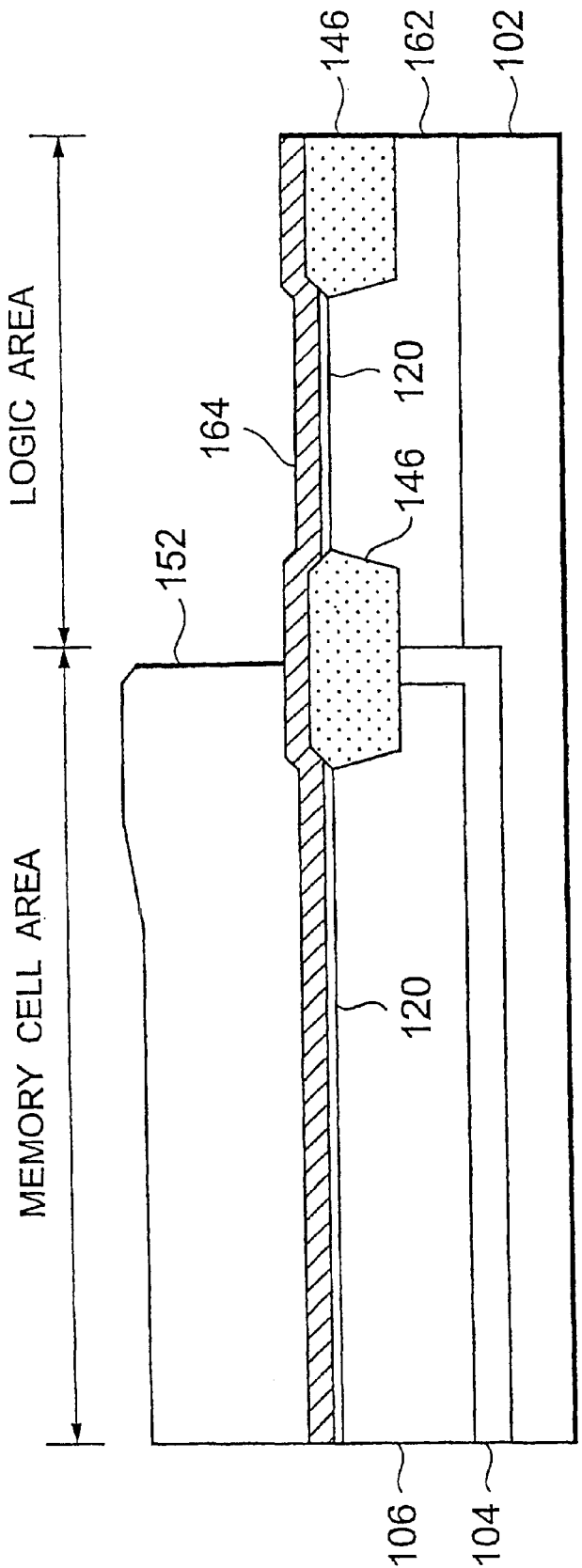
FIG. 7 is a part of the process drawing showing a manufacturing method for a nonvolatile semiconductor memory device according to an embodiment of the invention.

FIGS. 6(a) and (b) are sectional views respectively taken along line A—A' and line B—B' of the backing part 138 shown in FIG. 5, FIG. 6(a) shows a backing contact part of the selection gate electrode 124, and FIG. 6(b) shows a backing contact part of the control gate electrode 130.

As shown in FIG. 6(a), for backing of the selection gate electrode 124, at the cut lines of the floating gate electrode 128 and the control gate electrode 130, the selection electrode 124 is extended on a field oxide film 146 and connected to an upper layer backing aluminium wiring 158 through a contact hole 154 on a titanic silicide (TiSi) layer 162 on the surface thereof. The backing aluminium wiring 158 of the selection gate electrode 124 is, as shown in FIG. 5 and FIG. 6(a), formed on the layer insulating film 148 along the selection gate electrode 124 and the second gate electrode 126. That is, in a plan view shown in FIG. 5, the selection gate electrode 124, the second gate electrode 126 and the backing aluminium wiring 158 are superimposed.

On the other hand, as shown in FIG. 6(b), for backing of the control gate electrode 130, in the layer insulating film 148, a contact hole 156 is opened near the terminal ends of the floating gate electrode 128 and the control gate electrode 130, and the control gate electrode is connected to an upper layer backing aluminium wiring 160 through the contact hole 156. Not shown, the backing aluminium wiring 160 connected through the contact hole 156 on the upper side in the paper surface shown in FIG. 5 and the backing aluminium wiring 160 connected through the contact hole 156 on the lower side in the paper surface are connected to each other through a further upper layer aluminium wiring.

The advantage of the nonvolatile semiconductor memory device having such a structure will be clarified by the following description of a manufacturing method.

FIGS. 7 to 22 are process drawings showing a manufacturing method for a nonvolatile semiconductor memory device according to the present embodiment, and the manufacturing method for the nonvolatile semiconductor memory device according to the embodiment will now be described with reference to the drawings.

First, the field oxide film 146 is formed on the semiconductor substrate 102 by a known technology, an N-well 104 and a P-well 106 of the memory cell area are formed by an impurity diffusion method or ion implantation, and a P-well 162 of the logic area (area where the microcomputer is formed) is formed.

Secondly, a tunnel oxide film 120 is formed in an area not covered with the field oxide film 146, and subsequently a first polysilicon layer 164 is formed on the whole surface. After that, a photo resist is applied to the whole surface to form a designated photo resist pattern 152 shown in FIG. 7 by a well-known photo lithography method.

Subsequently, with the photo resist 152 as a mask, plasma etching is performed for the first polysilicon layer 164 to remove the first polysilicon layer 164 in an area not covered with the photo resist 152. In this case, the area not covered with the photo resist 152 is the whole surface of the logic area and a part of the memory cell area which becomes a separation pattern 144.

Figure 8:
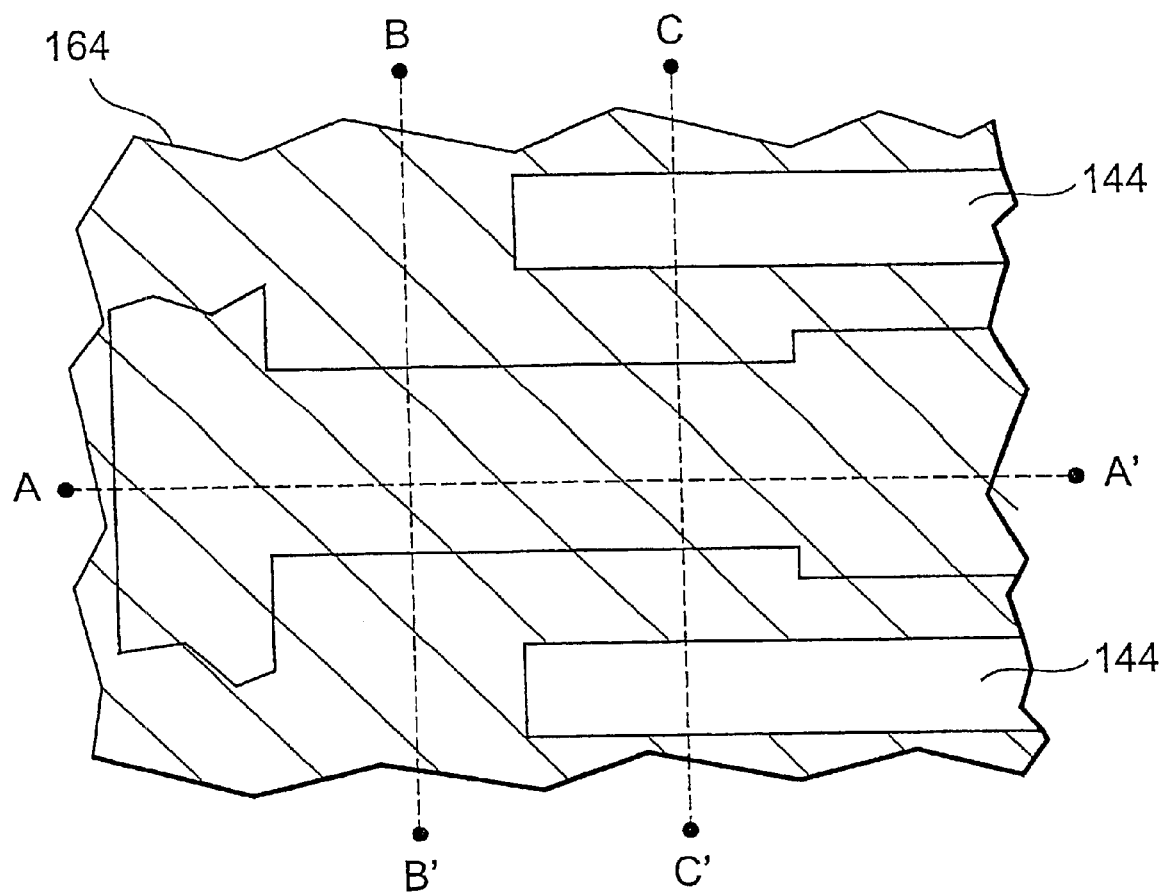
FIG. 8 is a part of the process drawing showing a manufacturing method for a nonvolatile semiconductor memory device according to an embodiment of the invention.

When such patterning is completed, the photo resist 152 is removed. FIG. 8 is a plan view of the memory cell area where such patterning is conducted. FIG. 9(a) is a sectional view taken along line A—A' of FIG. 8, FIG. 9(b) is a sectional view taken along line B—B' of FIG. 8, and FIG. 9(c) is a sectional view taken along line C—C' of FIG. 8. As clear from FIG. 9(a), by such patterning, the whole surface of the logic area is opened. On the other hand, as clear from FIG. 8 and FIG. 9(c), in the memory cell area, only a part which becomes a separation pattern 144 is opened. As described above, the separation pattern 144 is a slit for dividing the floating gate electrode 128 of each memory cell.

Figure 10:
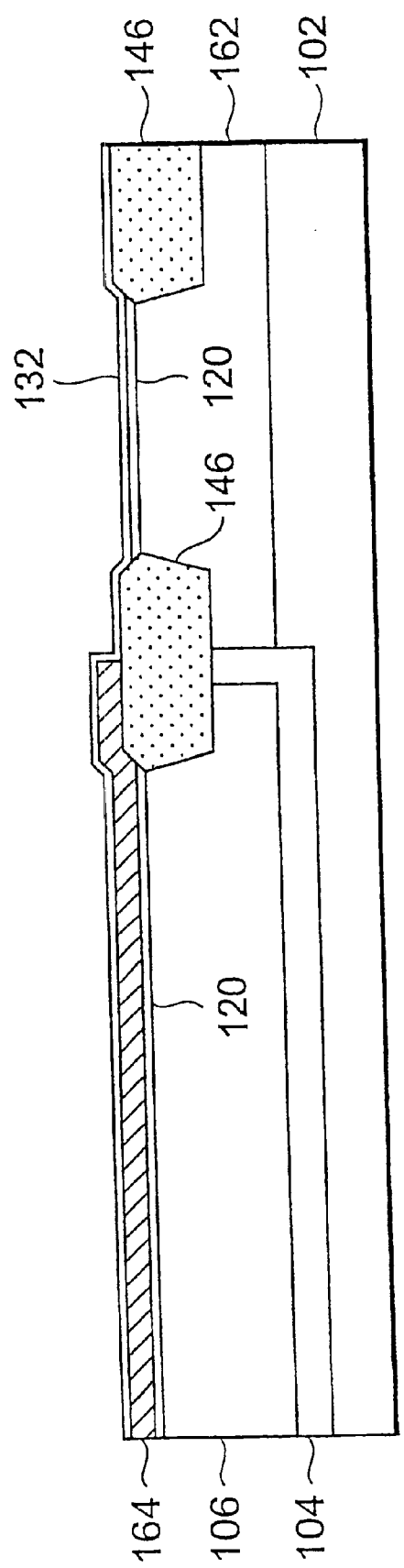
FIG. 10 is a part of the process drawing showing a manufacturing method for a nonvolatile semiconductor memory device according to an embodiment of the invention.

Subsequently, as shown in FIG. 10, a poly-poly insulating film 132 is formed on the whole surface. An ONO film or the like is preferable as the poly-poly insulating film 132.

Figure 11:
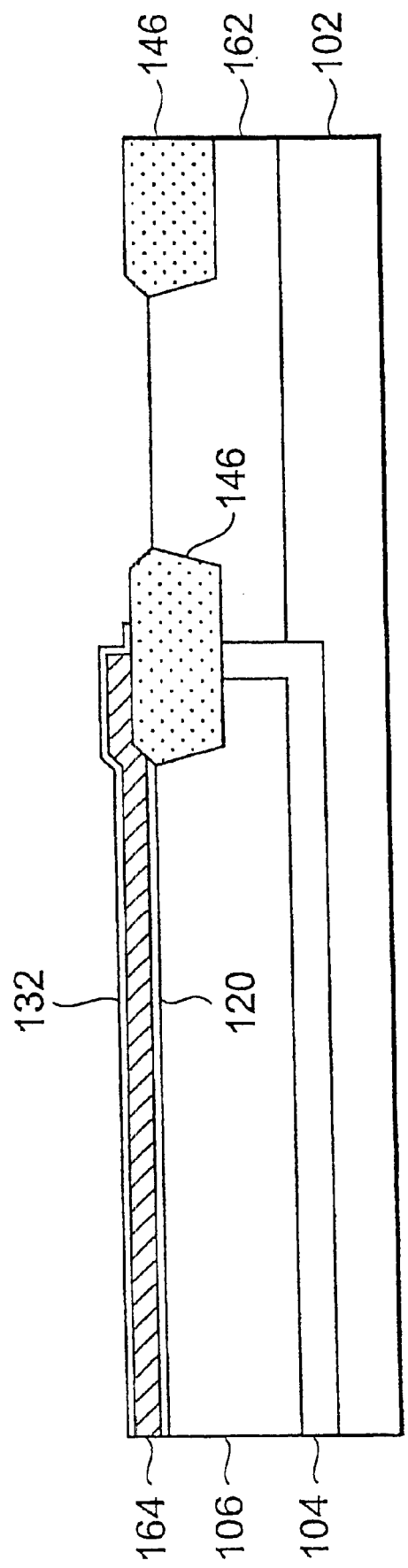
FIG. 11 is a part of the process drawing showing a manufacturing method for a nonvolatile semiconductor memory device according to an embodiment of the invention.
Figure 12:
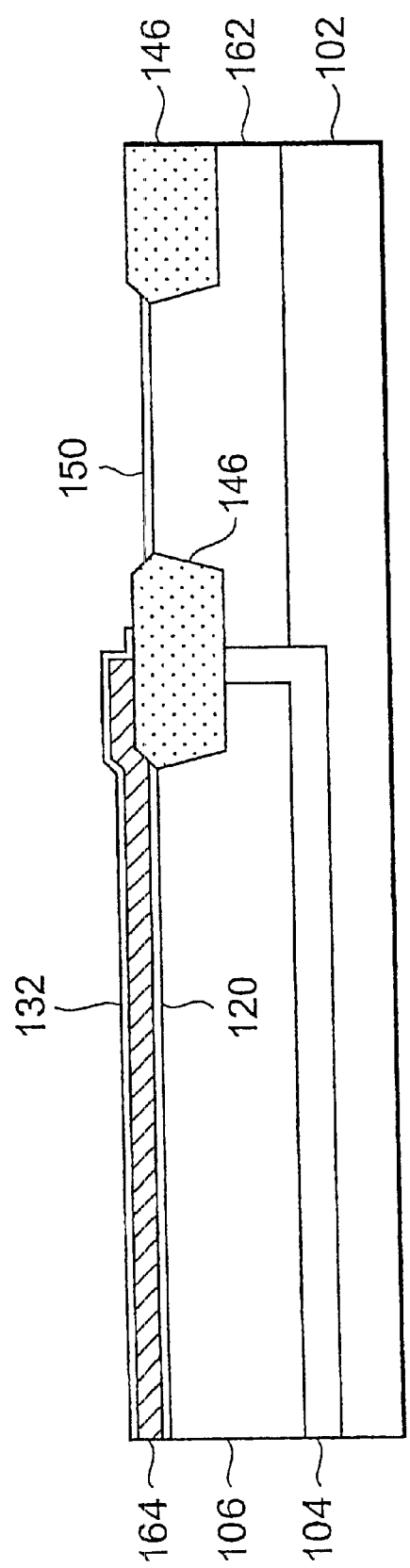
FIG. 12 is a part of the process drawing showing a manufacturing method for a nonvolatile semiconductor memory device according to an embodiment of the invention.

Subsequently, as shown in FIG. 11, patterning is performed by a well-known photo lithography technology to remove the poly-poly insulating film 132 and the tunnel oxide film 120 in the logic area. Thus, as shown in FIG. 11, in the logic area, the P-well 162 is again exposed. After the P-well 162 in the logic area is thus exposed, subsequently as shown in FIG. 12, a gate oxide film 150 is formed in the logic area on the P-well 162 by the thermal oxidation process.

Figure 13:
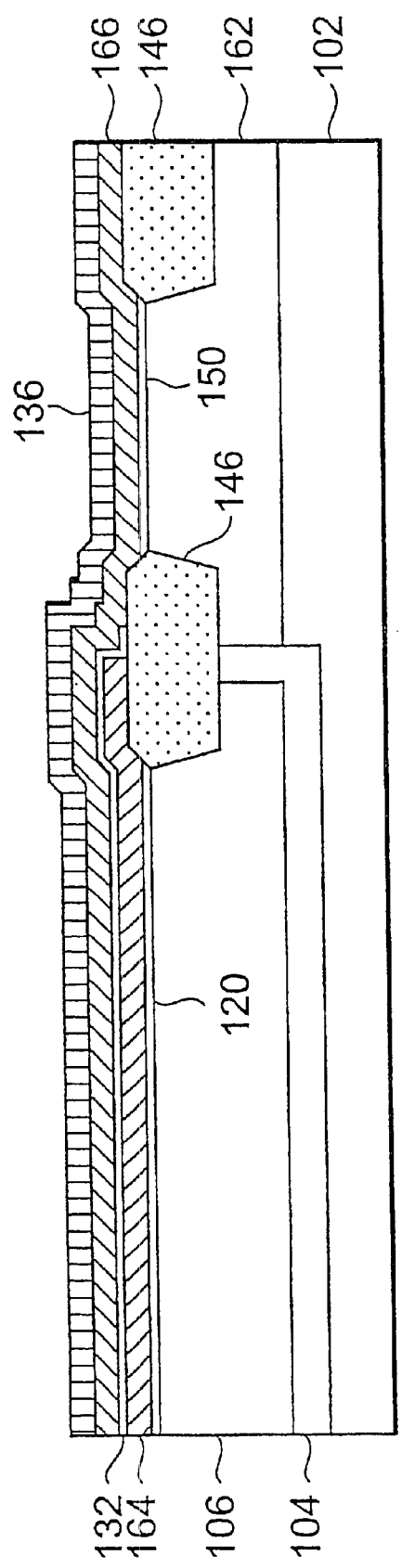
FIG. 13 is a part of the process drawing showing a manufacturing method for a nonvolatile semiconductor memory device according to an embodiment of the invention.

Subsequently, as shown in FIG. 13, a second polysilicon layer 166 is formed on the whole surface, and further a tungsten silicide (WSi) layer 136 is formed on the whole surface by sputtering.

By the process up to now, the formation of the bedding of the memory cell area and the logic area is completed. Subsequently, it is followed by the memory cell formation process and the logic transistor formation process.

Figure 14:
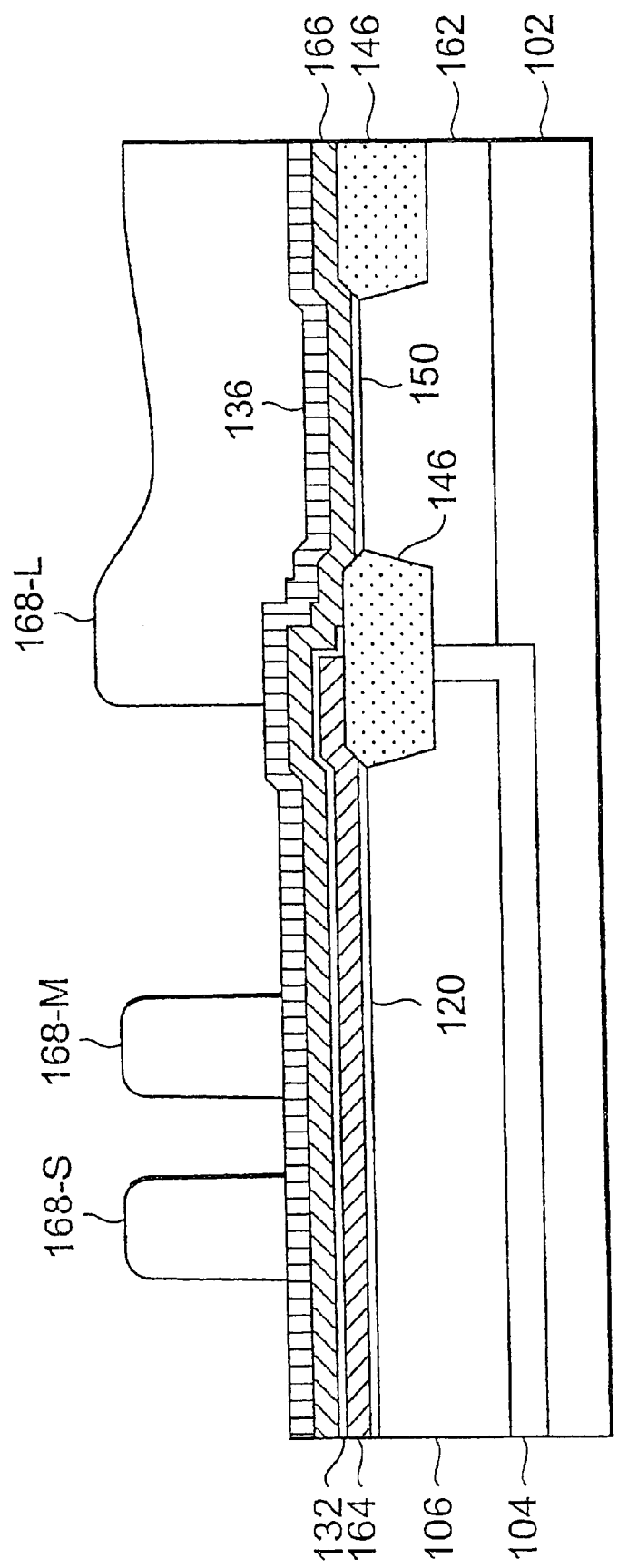
FIG. 14 is a part of the process drawing showing a manufacturing method for a nonvolatile semiconductor memory device according to an embodiment of the invention.

FIG. 14 shows the memory cell formation process. In the process, a photo resist is applied to the whole surface to form a designated photo resist pattern 168 shown in FIG. 14 by a well-known photo lithography method. The photo resist 168 comprises a part (168-L) for covering the whole surface of the logic area, a part (168-S) for covering an area of the memory cell area which becomes a selection transistor S and a part (168-M) for covering an area of the memory cell area which becomes a memory transistor M.

With the photo resist 168 formed by such three parts as a mask, plasma etching is performed for the tungsten silicide (WSi) layer 136, the second polysilicon layer 166, the poly-poly insulating film 132 and the first polysilicon layer 164 to remove the respective layers in an area not covered with the photo resist 168, so that the tunnel oxide film 120 is exposed. Further, ion implantation is performed in the P-well 106 through the exposed tunnel oxide film 120 to form a diffusion layer. After that, the photo resist 168 is removed.

Figure 15:
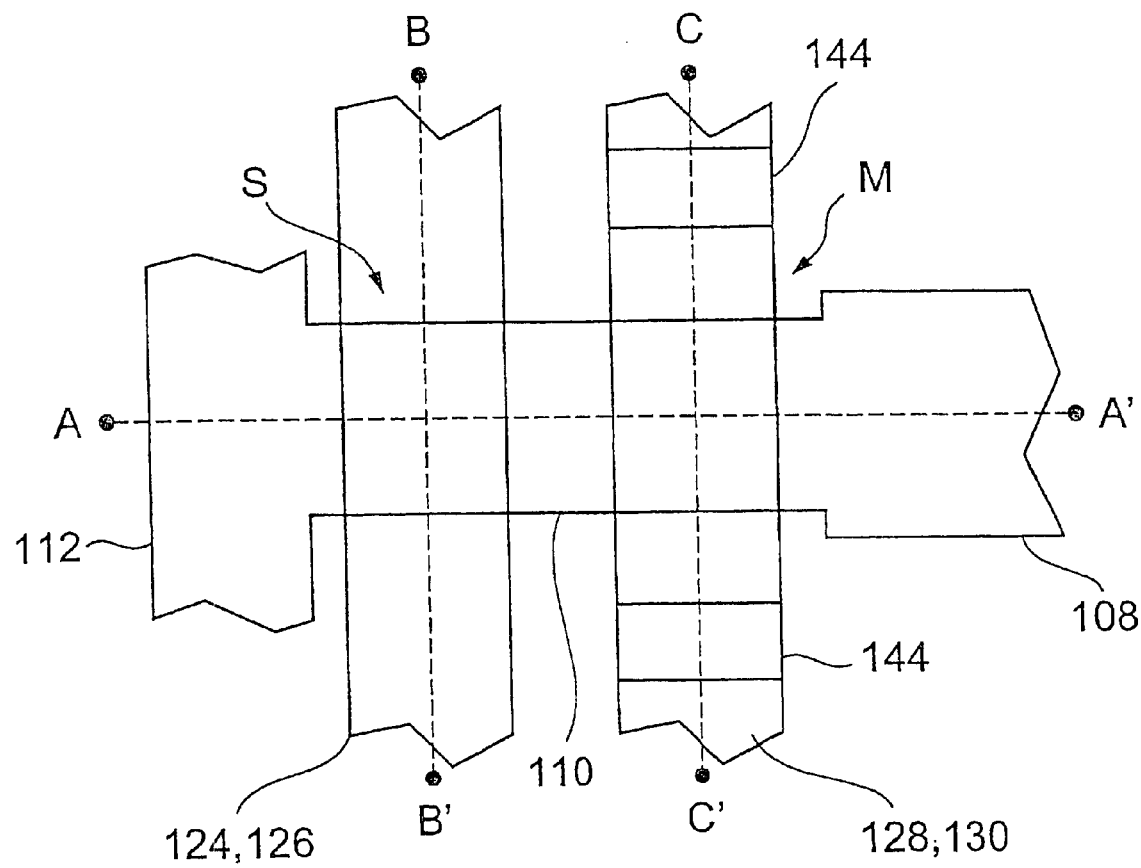
FIG. 15 is a part of the process drawing showing a manufacturing method for a nonvolatile semiconductor memory device according to an embodiment of the invention.
Figure 16A:
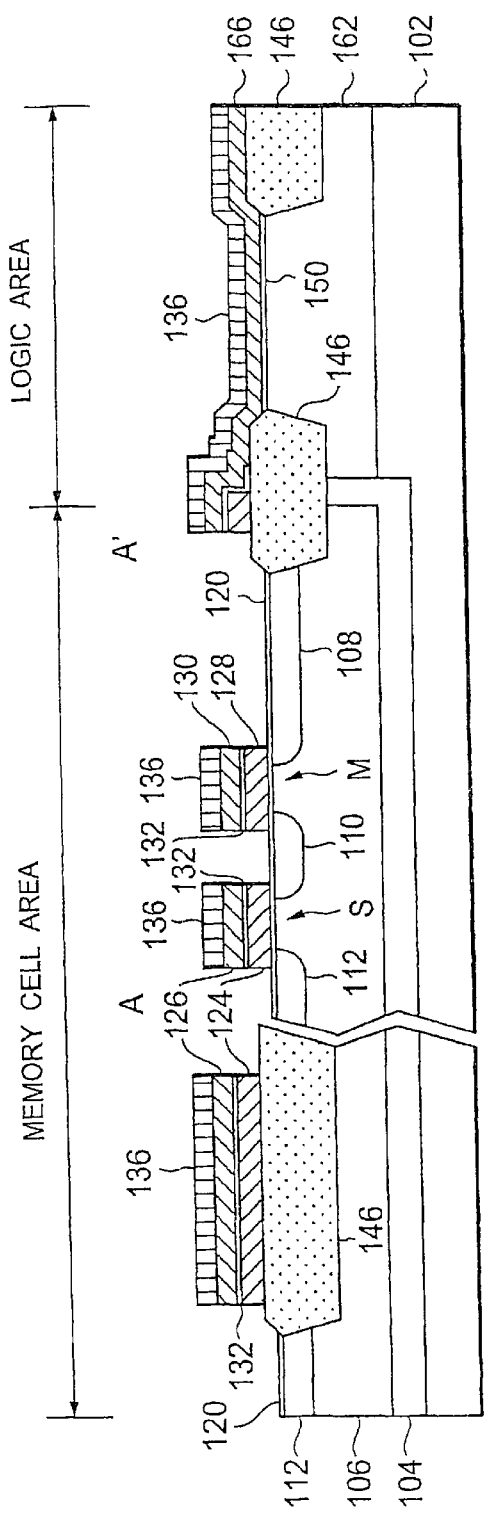
FIGS. 16(a) to 16(c) are sectional views taken along line A—A', line B—B' and line C—C' of FIG. 15, respectively.
Figure 16C:
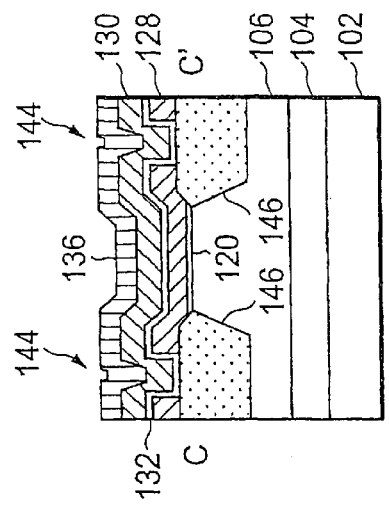
Figure 16B:
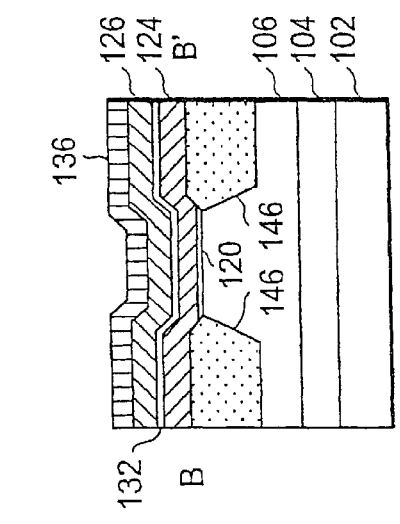

FIG. 15 is a schematic plan view showing the condition where such patterning and ion implantation are conducted. FIG. 16(a) is a sectional view taken along line A—A' of FIG. 15, FIG. 16(b) is a sectional view taken along line B—B' of FIG. 15, and FIG. 16(c) is a sectional view taken along line C—C' of FIG. 15.

By the above patterning process, as shown in FIG. 15, the gate electrodes 124, 126 of the selection transistor S and the gate electrodes 128, 130 of the memory transistor M are formed extending in the vertical direction of the paper surface. Thus, both the selection transistor S and the memory transistor M have a double-gate structure, but the separation pattern 144 is formed in the floating gate electrode 128 by the patterning process shown in FIG. 7 to FIG. 9, so that the floating gate electrode 128 is independent by each memory cell. The other gate electrodes, that is, the control gate electrode 130 of the memory transistor M, and the first gate electrode 124 and the second gate electrode 126 of the selection transistor S are all common to each memory cell. By the above patterning, the first polysilicon layer 164 in the selection transistor S part becomes the selection gate electrode 124, and the second polysilicon layer 166 becomes the second gate electrode 126. Further, the first polysilicon layer 164 in the memory transistor M part becomes the floating gate electrode 128, and the second polysilicon layer 166 becomes the control gate electrode 130.

The respective electrodes formed on the left end field oxide film 146 in FIG. 16(a) are the electrodes in the area which should be the backing part 138 of the selection gate electrode 124, and they correspond to a sectional view along line A—A' of FIG. 5 and FIG. 6(a).

The space between the gate electrode of the selection transistor S and the gate electrode of the memory transistor M will be described. Since patterning is, as shown in FIG. 14, performed for the gate electrodes at the same time by one photo resist 168, the space between both electrodes is reduced to the accuracy limit of mircroworking. For example, in the case where the working accuracy limit is 0.3 μm, the space between the electrodes can be reduced to 0.3 μm.

Figure 17:
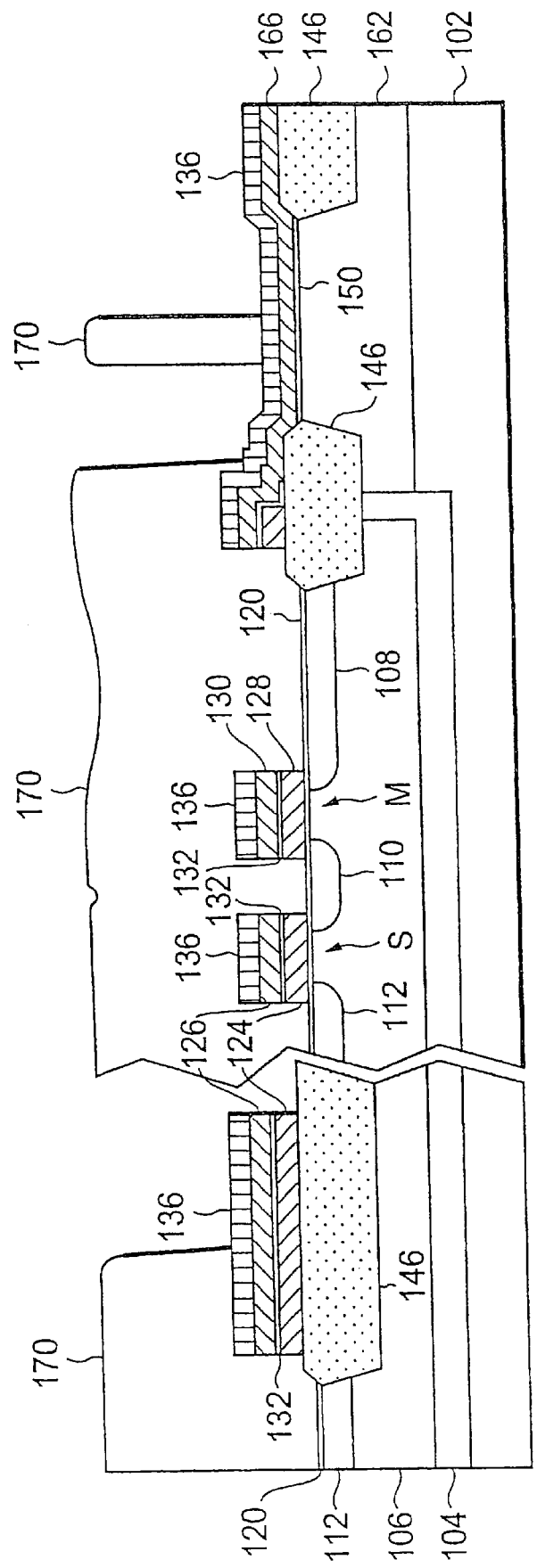
FIG. 17 is a part of the process drawing showing a manufacturing method for a nonvolatile semiconductor memory device according to an embodiment of the invention.

After the memory cell is formed, it transits to a process of forming a transistor in the logic area. First, a photo resist is applied to the whole surface to form a designated photo resist pattern 170 shown in FIG. 17 by a well-known photo lithography method. As shown in FIG. 17, the photo resist 170 covers the whole surface outside a part of the logic area which is to become the gate electrode and a part of the memory cell area which is to be the backing part 138 of the selection gate electrode.

Figure 18:
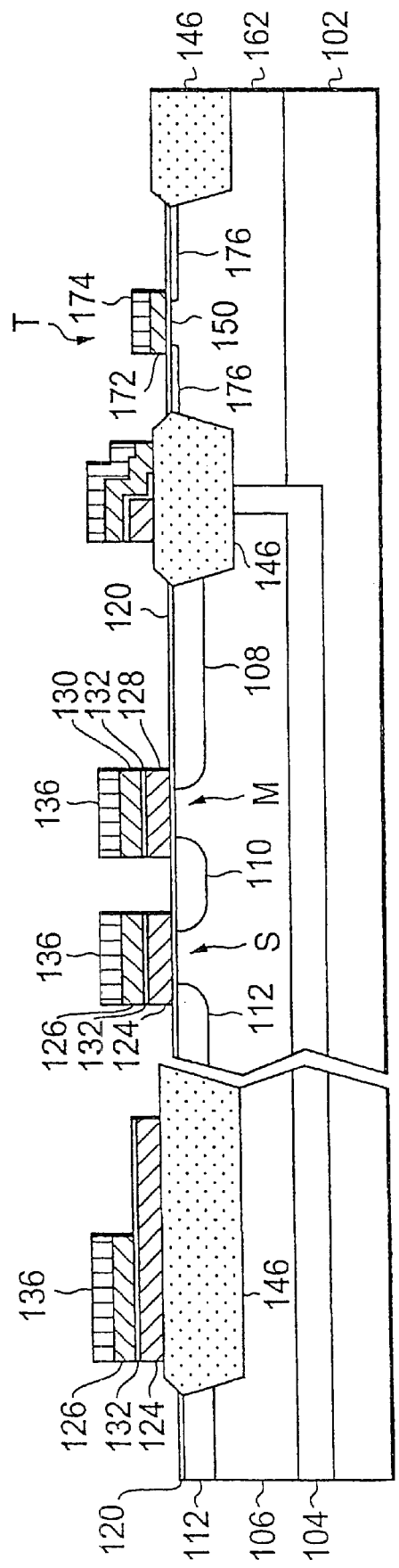
FIG. 18 is a part of the process drawing showing a manufacturing method for a nonvolatile semiconductor memory device according to an embodiment of the invention.

Subsequently, with the photo resist 170 as a mask, plasma etching is performed for the tungsten silicide (WSi) layer 136 and the second polysilicon layer 166 to remove the films in the area not covered with the photo resist 170, thereby exposing the poly-poly insulating film 132 and the gate oxide film 150. Further, LDD ion implantation is performed in the P-well 162 in the logic area through the exposed gate oxide film 150 to form a LDD diffusion layer 176. When such patterning and ion implantation are completed, the photo resist 170 is removed. Thus, the structure shown in FIG. 18 is obtained so that the gate electrode of the logic transistor T in the logic area is formed. That is, by such patterning, the second gate electrode 126 and the tungsten silicide (WSi) layer 136 are turned to a gate electrode 172 and a tungsten silicide (WSi) layer 174 of the logic transistor T.

Figure 19:
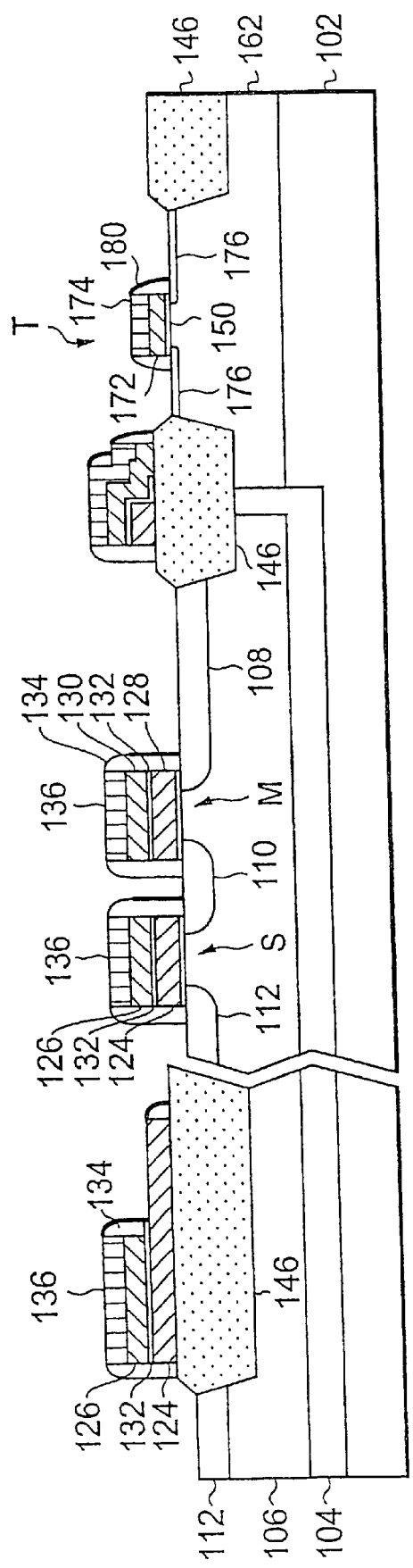
FIG. 19 is a part of the process drawing showing a manufacturing method for a nonvolatile semiconductor memory device according to an embodiment of the invention.

Subsequently, as shown in FIG. 19, side walls 134, 180 are formed in the respective gate electrodes of the selection transistor S, the memory transistor M and the logic transistor T by a well-known method. By this process, the exposed poly-poly insulating film 132, the tunnel oxide film 120 and the gate oxide film 150 are all removed.

Figure 20:
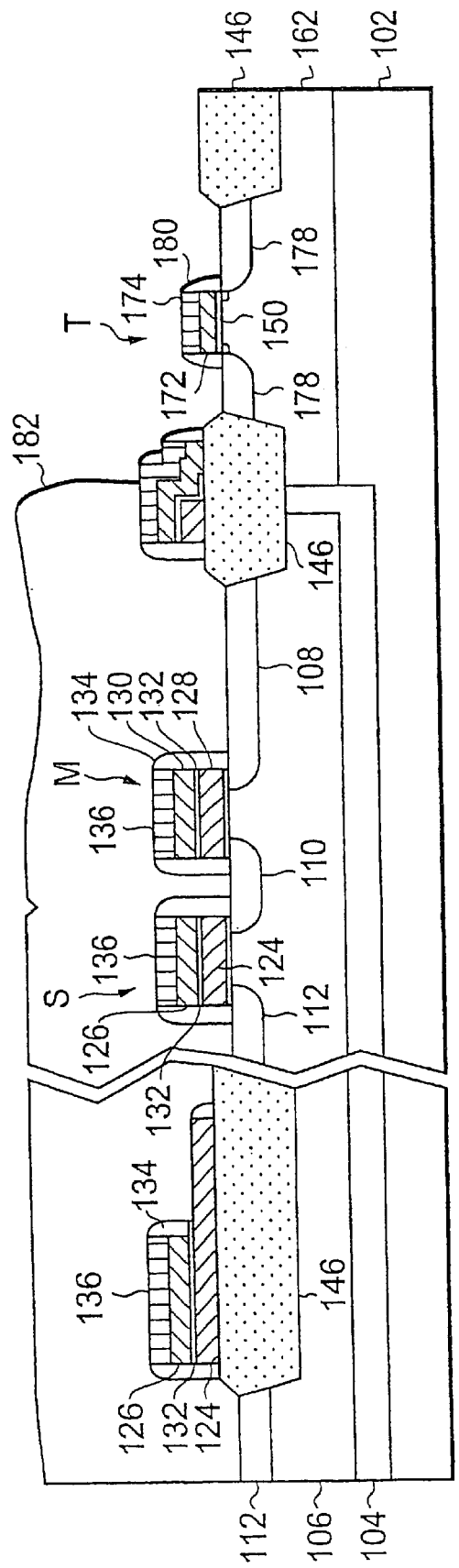
FIG. 20 is a part of the process drawing showing a manufacturing method for a nonvolatile semiconductor memory device according to an embodiment of the invention.

Subsequently, as shown in FIG. 20, a photo resist 182 for covering the whole surface of the memory cell area is formed, and with the photo resist as a mask, ion implantation is performed in the logic area to form a diffusion layer 178 of the logic transistor T. After that, the photo resist 182 is removed.

Figure 21:
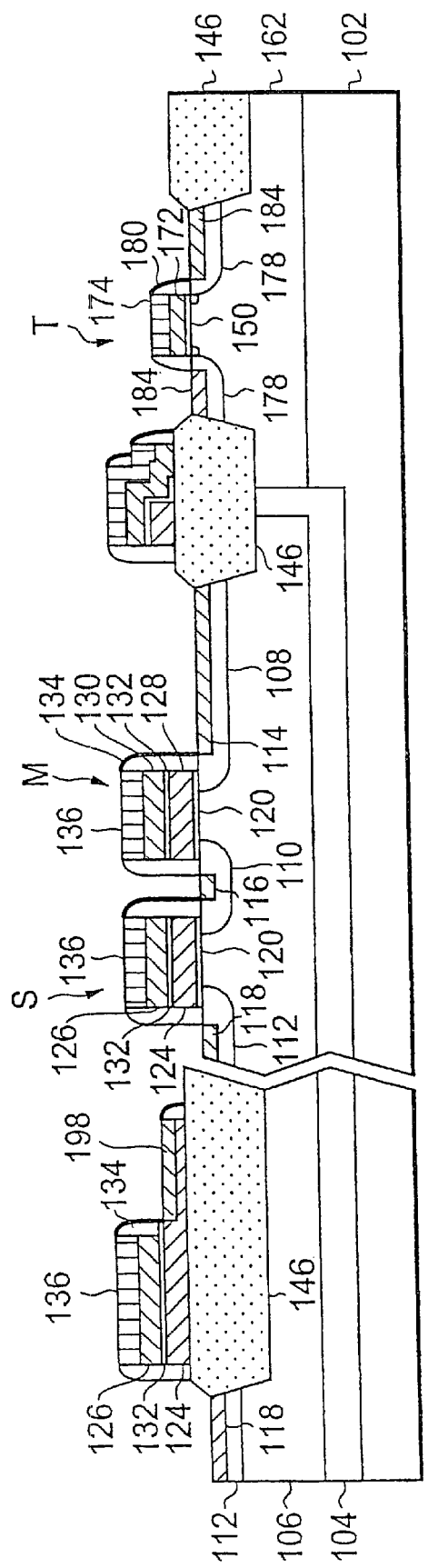
FIG. 21 is a part of the process drawing showing a manufacturing method for a nonvolatile semiconductor memory device according to an embodiment of the invention.

After the photo resist 182 is removed, titanium sputtering is performed. By such sputtering, as shown in FIG. 21, titanic silicide (TiSi) layers 114, 116 and 118 are formed on the diffusion layer surfaces of the selection transistor S and the memory transistor M, a titanic silicide (TiSi) layer 198 is formed on the surface of the selection gate electrode 124 exposed in the backing part 138, and a titanic silicide (TiSi) layer 184 is formed on the diffusion layer 178 surface of the logic transistor T.

Figure 22:
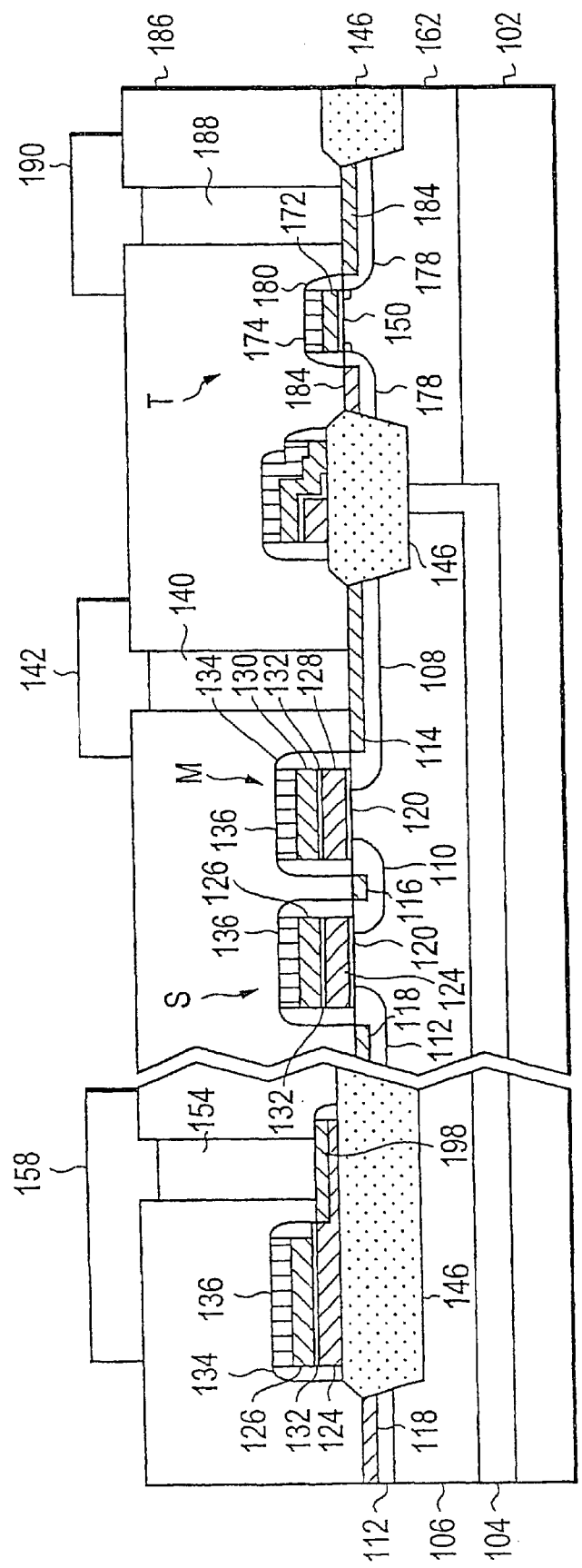
FIG. 22 is a part of the process drawing showing a manufacturing method for a nonvolatile semiconductor memory device according to an embodiment of the invention.

As shown in FIG. 22, a layer insulating film 186 is formed on the whole surface, and contact holes 154, 140 and 188 are provided in the film, thereby connecting the selection gate electrode 124 to the backing aluminium wiring 158, the drain region 108 of the memory transistor M to the aluminium wiring layer 142, and the diffusion layer 178 of the logic transistor T to an aluminium wiring layer 190, respectively. In FIG. 22, the backing aluminium wiring 160 connected to the control gate electrode 130 of the memory transistor M is not shown, but needless to say, it is formed simultaneously with the aluminium wiring layers 158, 142 and 190. After that, a further upper layer wiring layer for connecting the backing aluminium wirings 160 to each other is formed. This is not shown like FIG. 5 and FIG. 6.

As described above, in the nonvolatile semiconductor memory device of the embodiment, the gate electrode of the memory transistor M and the gate electrode of the selection transistor S have the substantially same structure, and patterning for the gate electrodes is performed by one photo lithography process, so that the space between the gate electrodes of both transistors can be reduced to the working accuracy limit so as to remarkably contribute to high integration. For example, when the gate length of the memory transistor M is 0.4 μm, the width of the source region 110 of the memory transistor M is 0.8 μm, the radius of the contact hole 140 is 0.2 μm, the gate-source margin is 0.1 μm, and the gate-contact margin is 0.3 μm, the cell length 8 of the memory cell (the length from the center of the source region 112 to the center of the contact hole 140) is 2.1 μm. Thus, the memory cell length is remarkably reduced as compared with 2.9 μm which is the memory cell length of the nonvolatile semiconductor memory device disclosed in Japanese Patent Laid-Open No. 7-297304, and the cell area is also reduced to about 72%.

Furthermore, with consideration of integrating such a nonvolatile semiconductor memory device on the same semiconductor substrate as the logic circuit of the microcomputer or the like, as known from the above description, the compatibility in process is very good. That is, there are many common processes. For example, the upper layer gate electrode (the control gate electrode 130) of the memory transistor M and the upper layer gate electrode (the second gate electrode 126) of the selection transistor S can be formed by the same conductive film as that of the gate electrode of the logic transistor T, and also in the gate electrode patterning process for the logic transistor T, patterning for forming the backing part of the selection gate electrode 124 can be simultaneously performed. This is a major advantage of the invention that can not be obtained by the split gate type memory cell.

The second gate electrode 126 which is the upper layer gate electrode of the selection transistor S is not used. Accordingly, the electrically floating state may be sufficient, but if consideration is given to the influence of noise or the like, it is preferable that the gate is biased with a designated potential. In this case, by the same method as that for backing the control gate electrode 130, the gate may be connected to the upper layer aluminium wiring, so that designated potential is supplied to the aluminium wiring. Further it is preferable that the same potential as the potential applied to the selection gate electrode 124 is supplied to the second gate electrode 126. In this case, the second gate electrode 126 may be led out to the upper layer aluminium wiring to be connected to the backing aluminium wiring 158 of the selection gate electrode 124.

A nonvolatile semiconductor memory device according to another embodiment of the invention will now be described with reference to FIGS. 23 to 25. In the nonvolatile semiconductor memory device of the present embodiment, a process of reducing the selection gate electrode 124 in resistance is added to the embodiment described before. That is, for reducing the resistance of the selection gate electrode 124, it will be sufficient to heighten the impurity concentration of the first polysilicon layer 164 forming the selection gate electrode 124. However, as the first polysilicon layer 164 is also used as the floating gate electrode 128 of the memory transistor M, in consideration of influence on the tunnel oxide film 120, the impurity concentration of the first polysilicon layer 164 can not be so heightened.

The nonvolatile semiconductor memory device of the present embodiment is to solve such a problem, and in the manufacturing method for the nonvolatile semiconductor memory device according to the preceding embodiment, an addition process is inserted between the process shown in FIG. 20 and the process shown in FIG. 21.

Figure 23:
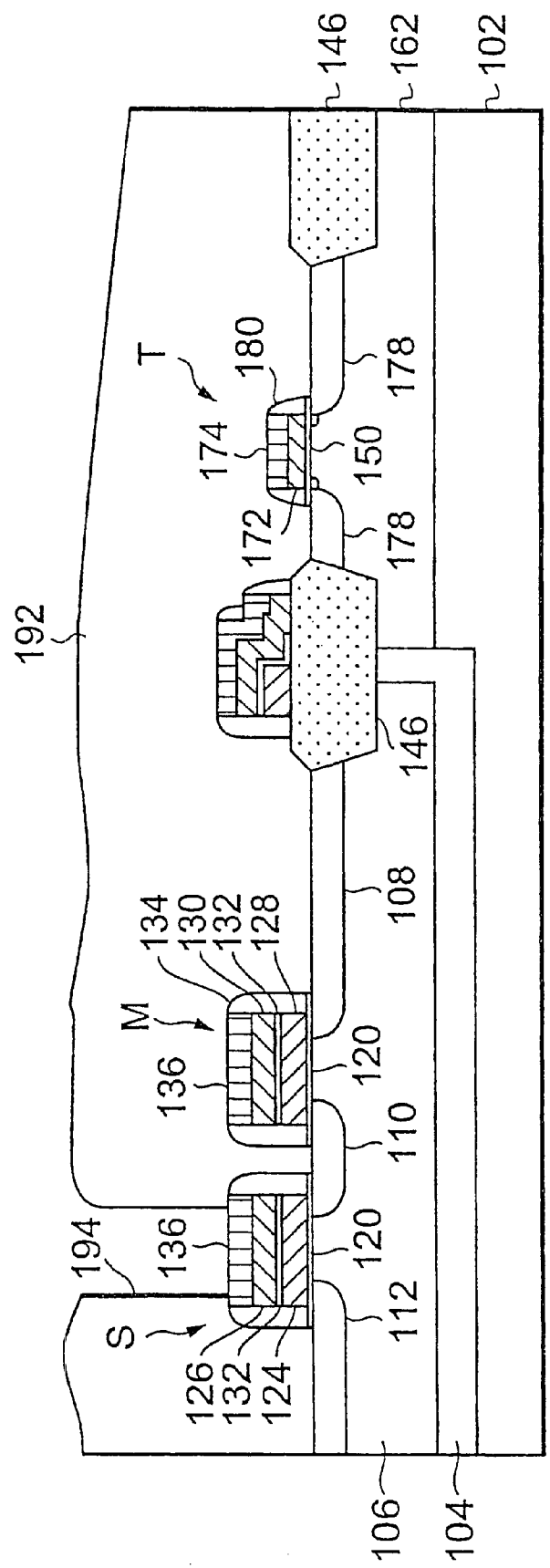
FIG. 23 is a part of the process drawing showing a manufacturing method for a nonvolatile semiconductor memory device according to another embodiment of the invention.

After the side walls 134, 180 are formed, as shown in FIG. 23, a photo resist 192 is applied to the whole surface to provide an opening 194 only in a part corresponding to the gate electrode of the selection transistor S by the well-known photo lithography. In the case of conducting this process simultaneously with the other patterning process in the logic area, the number of processes will not be increased.

Figure 24:
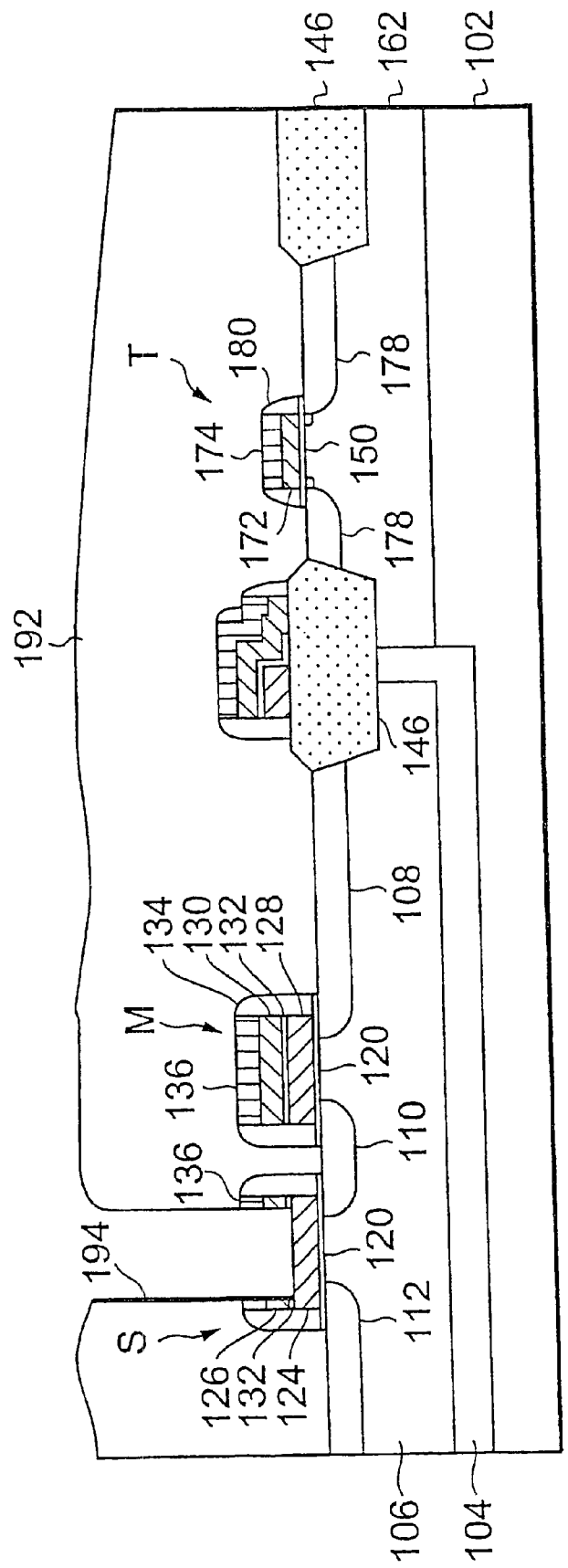
FIG. 24 is a part of the process drawing showing a manufacturing method for a nonvolatile semiconductor memory device according to another embodiment of the invention.
Figure 25:
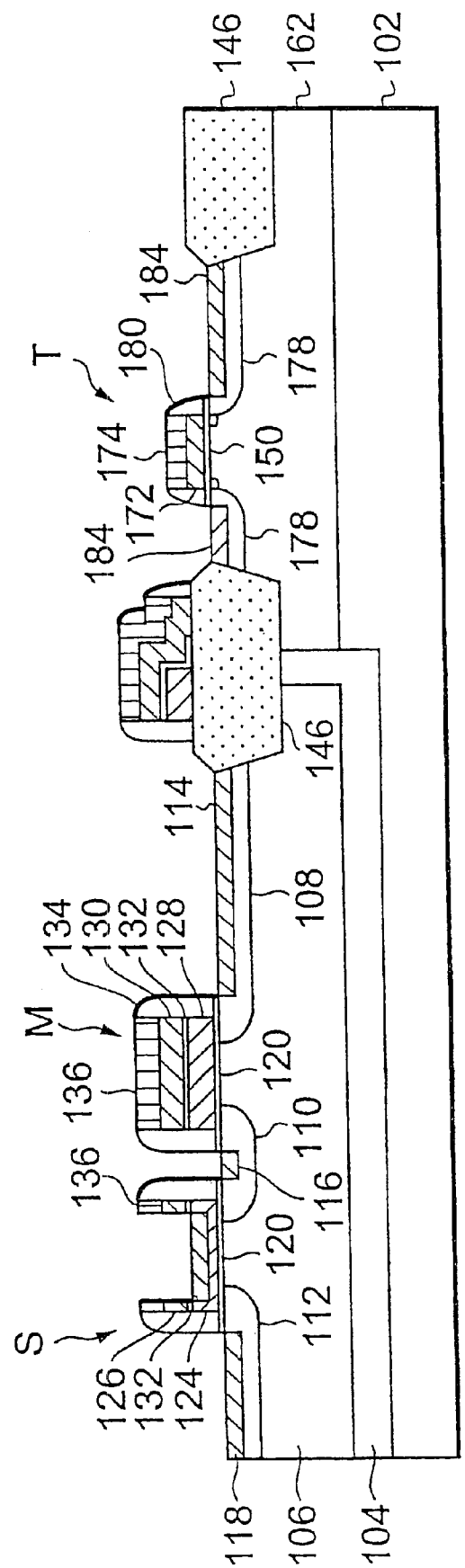
FIG. 25 is a part of the process drawing showing a manufacturing method for a nonvolatile semiconductor memory device according to another embodiment of the invention.
Figure 26:
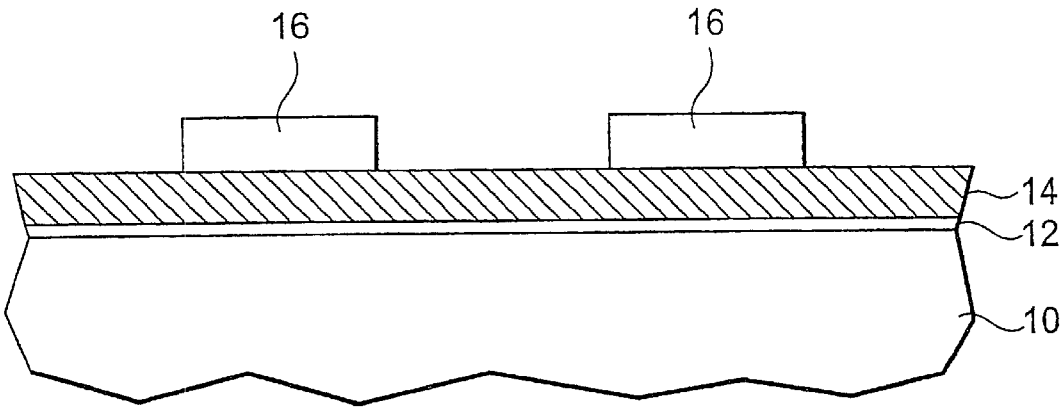
FIG. 26 is a part of the process drawing showing the conventional manufacturing method for a nonvolatile semiconductor memory device.
Figure 27:
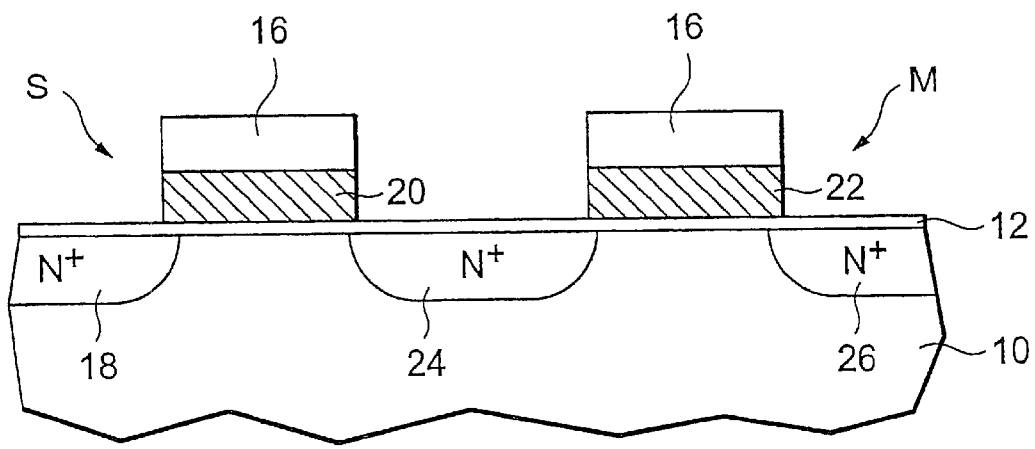
FIG. 27 is a part of the process drawing showing the conventional manufacturing method for a nonvolatile semiconductor memory device.
Figure 28:
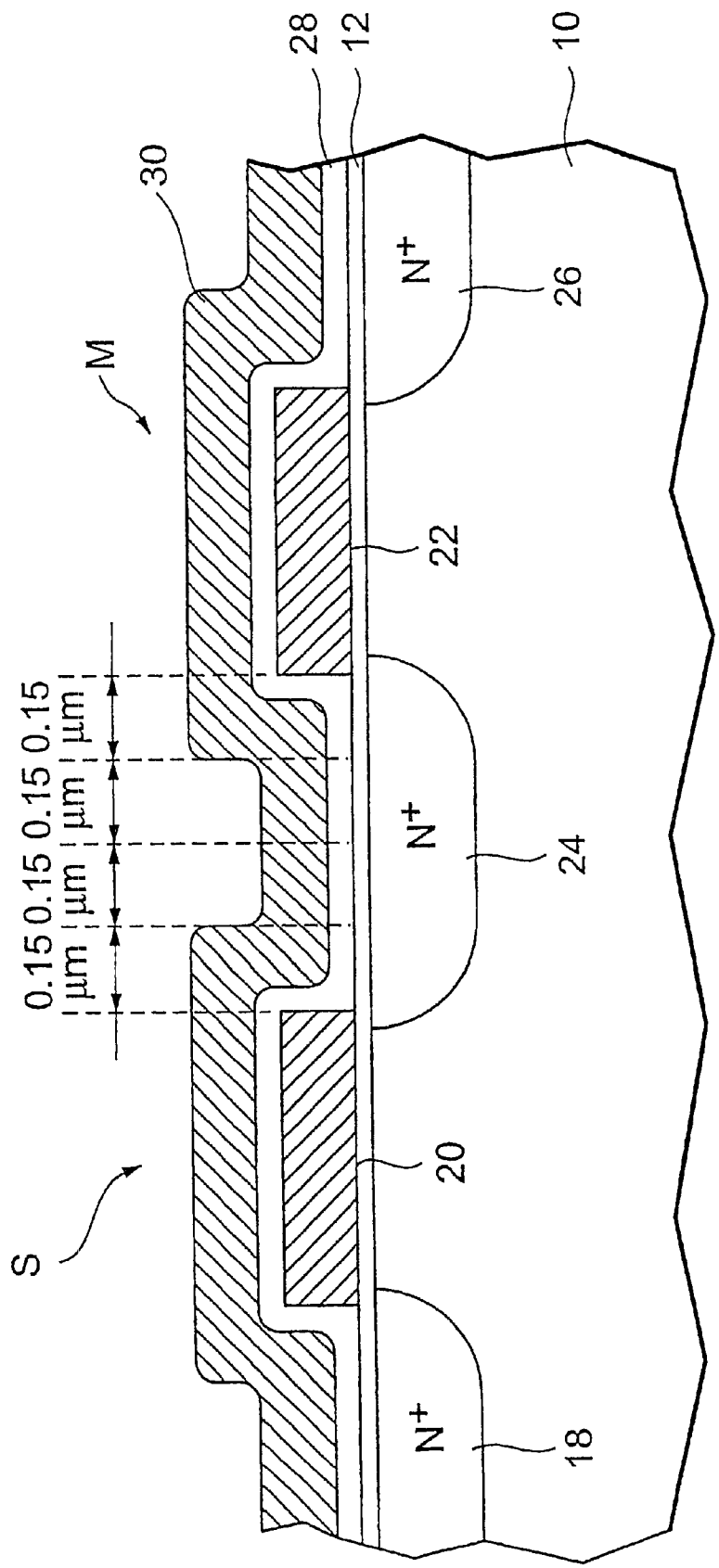
FIG. 28 is a part of the process drawing showing the conventional manufacturing method for a nonvolatile semiconductor memory device.
Figure 29:
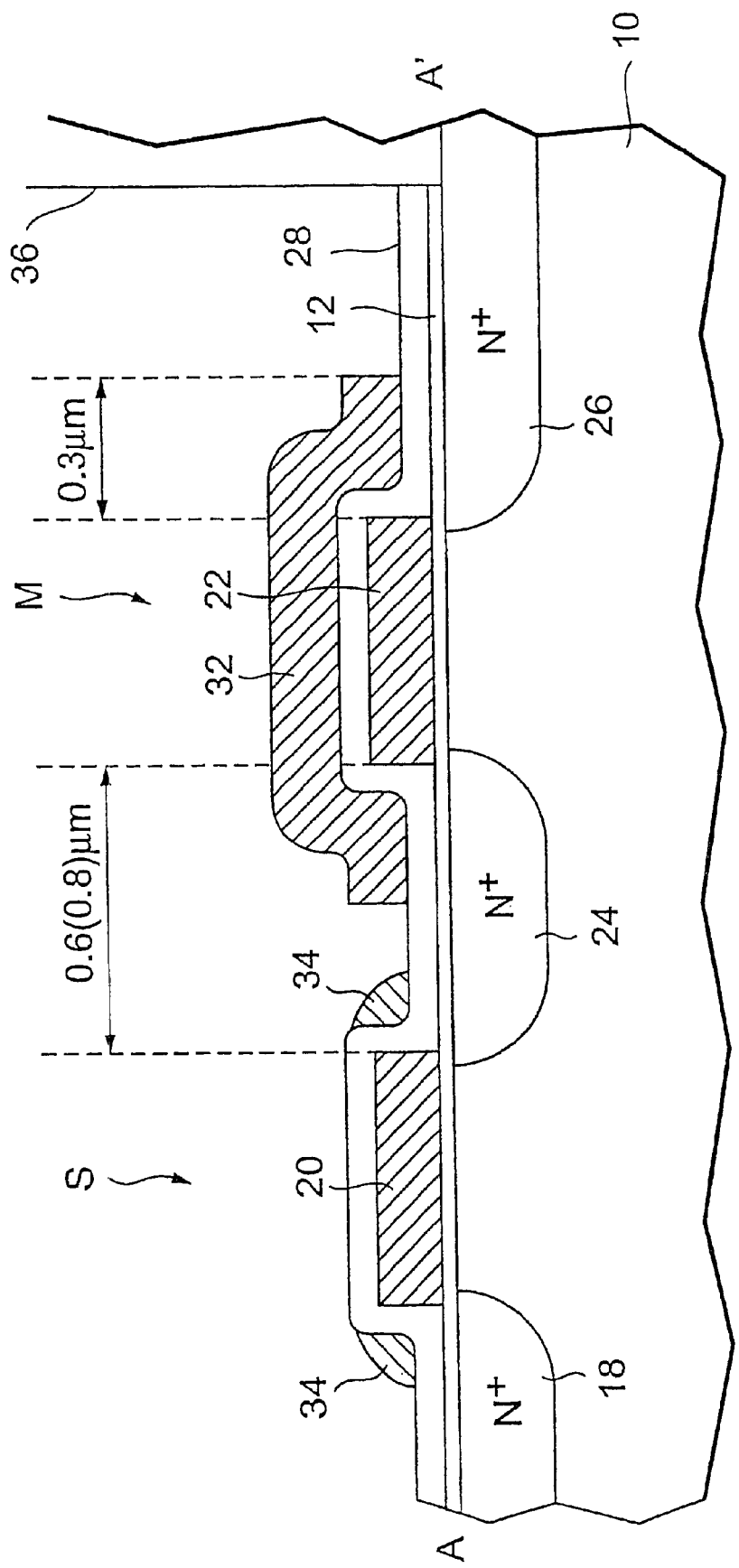
FIG. 29 is a part of the process drawing showing the conventional manufacturing method for a nonvolatile semiconductor memory device.
Figure 30:
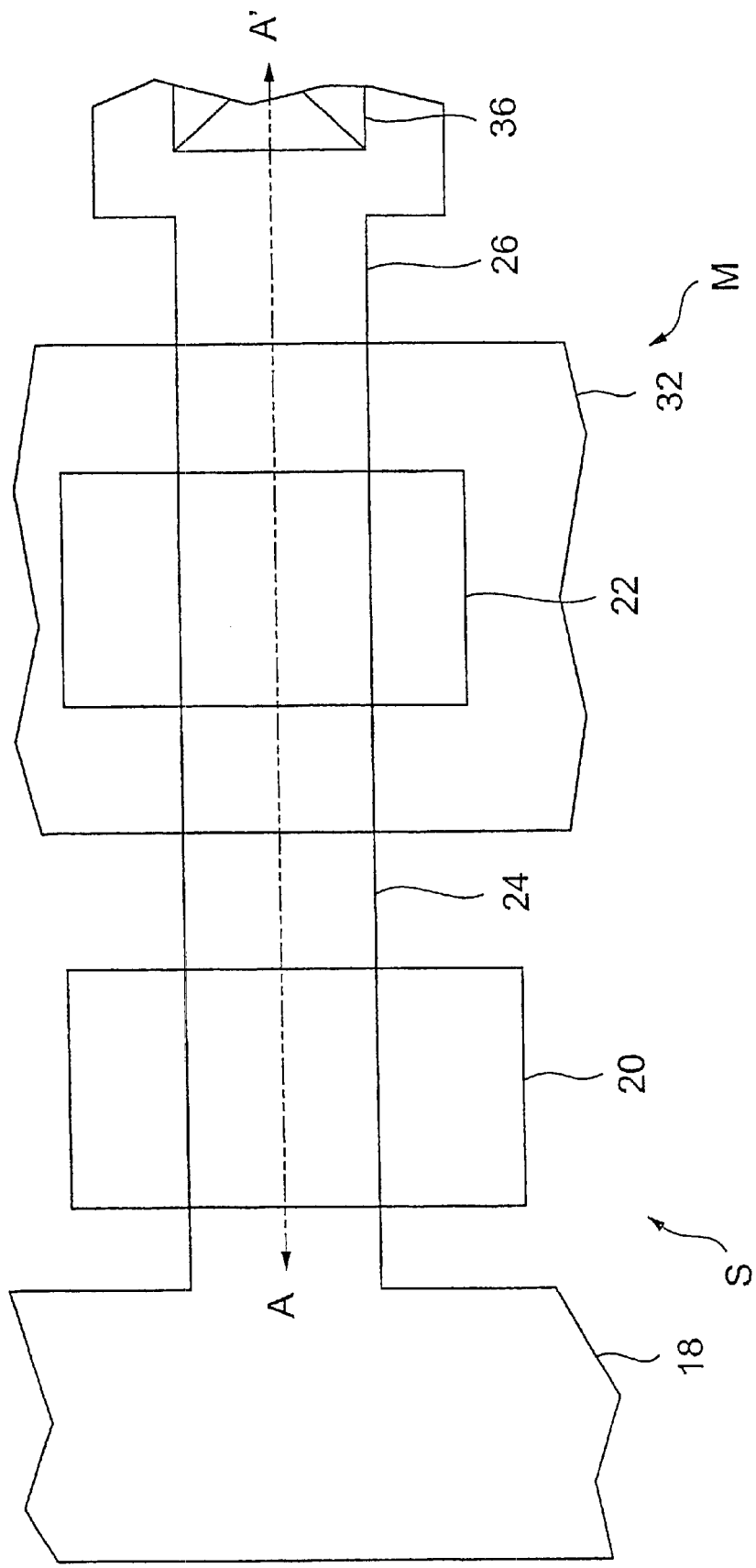
FIG. 30 is a plan view showing the structure of the conventional nonvolatile semiconductor memory device.

Subsequently, as shown in FIG. 24, with the photo resist 192 as a mask, the tungsten silicide (WSi) layer 136, the second gate electrode 126 and the poly-poly insulating film 132 are removed by plasma etching. Thus, as shown in FIG. 24, the selection gate electrode 124 is exposed, so that in the subsequent silicide formation process, a titanic silicide (TiSi) layer 196 is formed on the selection gate electrode 124 too.

According to the embodiment, the titanic silicide (TiSi) layer 196 is formed on the selection gate electrode 124, so that the word line sheet resistance of the selection gate electrode 124 can be reduced to several Q so as to accelerate the memory cell read operation.

Effect of the Invention

According to the invention, as described above, in the nonvolatile semiconductor memory device and the manufacturing method therefor, the gate electrode of the memory transistor M and the gate electrode of the selection transistor S have the substantially same structure, and patterning is performed for the gate electrodes at a time by the photo lithography process, so that the space between the gate electrodes of both transistors can be reduced to the working accuracy limit.

Furthermore, according to the microcomputer with a built-in nonvolatile semiconductor memory device and the manufacturing method therefor, the manufacturing process for the memory cell area and the manufacturing process for the logic area are very compatible with each other, so that a remarkable increase in the manufacturing process will not be caused so as to hold down the manufacturing cost to the lowest.

What is claimed is:

1. A nonvolatile semiconductor memory device comprising:

first, second and third impurity diffusion regions in a semiconductor substrate;

a first gate insulating film on said semiconductor substrate between said first and second impurity diffusion regions;

a second gate insulating film on said semiconductor substrate between said second and third impurity diffusion regions;

a floating gate electrode on said first gate insulating film;

a selection gate electrode on said second gate insulating film;

a third gate insulating film on said floating gate electrode;

a fourth gate insulating film on said selection gate electrode;

a control gate electrode on said third gate insulating film; and an additional gate electrode on said fourth gate insulating film, wherein said first and second impurity diffusion regions, said first and third gate insulating films, said floating gate electrode, and said control gate electrode constitute a memory transistor, said second and third impurity diffusion regions, said second and fourth gate insulating films, said selection gate electrode, and said additional gate electrode constitute a selection transistor, and said memory transistor and said selection transistor having the substantially same structure as each other.

2. A nonvolatile semiconductor memory device comprising:

first, second and third impurity diffusion regions in a semiconductor substrate;

a first gate insulating film on said semiconductor substrate between said first and second impurity diffusion regions;

a second gate insulating film on said semiconductor substrate between said second and third impurity diffusion regions;

a floating gate electrode on said first gate insulating film;

a selection gate electrode on said second gate insulating film;

a third gate insulating film on said floating gate electrode;

a fourth gate insulating film on said selection gate electrode;

a control gate electrode on said third gate insulating film; and an additional gate electrode on said fourth gate insulating film, wherein said additional gate electrode is in an electrically floating state.

3. The nonvolatile semiconductor memory device according to claim 1, wherein said additional gate electrode is supplied with a predetermined voltage.

4. A nonvolatile semiconductor memory device comprising:

first, second and third impurity diffusion regions in a semiconductor substrate;

a first gate insulating film on said semiconductor substrate between said first and second impurity diffusion regions;

a second gate insulating film on said semiconductor substrate between said second and third impurity diffusion regions;

a floating gate electrode on said first gate insulating film;

a selection gate electrode on said second gate insulating film;

a third gate insulating film on said floating gate electrode;

a fourth gate insulating film on said selection gate electrode;

a control gate electrode on said third gate insulating film; and an additional gate electrode on said fourth gate insulating film, wherein said additional gate electrode is electrically connected to said selection gate electrode.

5. The nonvolatile semiconductor memory device according to claim 1, wherein said nonvolatile semiconductor memory device is fabricated on a memory region of said semiconductor substrate, said semiconductor substrate further having a logic region on which a logic circuit is fabricated.

6. A nonvolatile semiconductor memory device, comprising:

a plurality of floating gate electrodes located in line in a predetermined direction;

a first insulating film formed on said plurality of floating gate electrode extended to said direction;

a control gate electrode formed on said first insulating film extended to said direction;

a selection gate electrode located in line along said plurality of floating gate electrodes in said predetermined direction, a second insulating film formed on said selection gate electrodes extended to said direction; and an additional gate electrode formed on said second insulating film extended to said direction, wherein said control gate electrode has a plurality of portions that each correspond to a different one of said floating gate electrodes, each of said floating gate electrodes and each of said portions of said control gate electrodes constituting a gate electrode of a memory transistor, wherein said selection gate electrode has a plurality of portions that are each adjacent to a different one of said floating gate electrodes and said additional gate electrode has a plurality of portions that each correspond to respective portions of said selection gate electrode and, wherein each pair of one said portion of said selection gate electrode and one corresponding said portion of said additional gate electrodes constitutes a gate electrode of a selection transistor.

7. The nonvolatile semiconductor memory device as claimed in claim 6, wherein said memory transistor is adjacent to said selection transistor, said memory transistor and said selection transistor constitute a memory cell.

8. The nonvolatile semiconductor memory device according to claim 1, wherein said additional gate electrode is in an electrically floating state.

9. The nonvolatile semiconductor memory device according to claim 1, wherein said additional gate electrode is electrically connected to said selection gate electrode.

10. The nonvolatile semiconductor memory device according to claim 6, wherein said additional gate electrodes are in an electrically floating state.

11. The nonvolatile semiconductor memory device according to claim 1, wherein said additional gate electrodes are supplied with a predetermined voltage.

12. The nonvolatile semiconductor memory device according to claim 6, wherein said additional gate electrode is electrically connected to said selection gate electrode.

13. The nonvolatile semiconductor memory device according to claim 1, further comprising:

a first silicide layer on said first control gate electrode; and a second silicide layer on said additional gate electrode.

14. The nonvolatile semiconductor memory device according to claim 6, further comprising:

a first silicide layer on said first control gate electrode; and a second silicide layer on said additional gate electrode.

* * * * *